United States Patent
Schmidt

(10) Patent No.: US 11,508,883 B2
(45) Date of Patent: Nov. 22, 2022

(54) IR EMITTING PYROXENE PHOSPHORS AND LIGHT EMITTING DEVICE USING THE SAME

(71) Applicant: LUMILEDS LLC, San Jose, CA (US)

(72) Inventor: Peter Josef Schmidt, Aachen (DE)

(73) Assignee: Lumileds LLC, San Jose, CA (US)

( * ) Notice: Subject to any disclaimer, the term of this patent is extended or adjusted under 35 U.S.C. 154(b) by 206 days.

(21) Appl. No.: 16/829,932

(22) Filed: Mar. 25, 2020

(65) Prior Publication Data

US 2021/0305468 A1 Sep. 30, 2021

(51) Int. Cl.
*H01L 33/50* (2010.01)
*C09K 11/77* (2006.01)

(52) U.S. Cl.
CPC ............ *H01L 33/504* (2013.01); *C09K 11/77* (2013.01)

(58) Field of Classification Search
CPC ...... H01L 33/504; H01L 33/502; C09L 11/08; C09K 11/77
See application file for complete search history.

(56) References Cited

U.S. PATENT DOCUMENTS

2017/0331012 A1* 11/2017 Heidemann ............ C09K 11/02

OTHER PUBLICATIONS

The extended European search report corresponding to EP application No. 20169345.4, dated Dec. 17, 2020, 4 pages.
Xu Xiaoxue et al, "Highly efficient and thermally stable Cr3+-activated silicate phosphors for broadband near-infrared LED applications", Chemical Engineering Journal, Elsevier, Amsterdam, NL, vol. 383, Oct. 9, 2019, 8 pages.
Huang Yisheng et al., "Effects of Cr3+ion concentration on the spectral characterization in Cr3+: Ca0.93Mg1.07Si2O6crystals", Journal of Luminescence, vol. 211, Mar. 9, 2019, 6 pages.

* cited by examiner

*Primary Examiner* — Sarah K Salerno

(57) ABSTRACT

The invention provides luminescent material comprising $E_{1-w}Sc_{1-x-y-u-w}M_yZ_uA_{2w}Si_{2-z-u}Ge_zAl_uO_6:Cr_x$, wherein:
E comprises one or more of Li, Na, and K;
M comprises one or more of Al, Ga, In, Tm, Yb, and Lu;
Z comprises one or more of Ti, Zr, and Hf;
A comprises one or more of Mg, Zn, and Ni;
$0<x\leq0.25$;
$0\leq y\leq0.75$;
$0\leq z\leq2$;
$0\leq u\leq1$;
$0\leq w\leq1$;
$x+y+u+w\leq1$; and
$z+u\leq2$.

20 Claims, 5 Drawing Sheets

(I)

(II)

(III)

IR EMITTING PYROXENE PHOSPHORS AND LIGHT EMITTING DEVICE USING THE SAME

FIELD OF THE INVENTION

The invention relates to a luminescent material and to a luminescent material composition comprising such luminescent material. The invention further relates to a device comprising such luminescent material.

BACKGROUND

Trivalent chromium comprising luminescent materials are known in the art. X. Xu, et al., Chemical Engineering Journal 383 (2020) 123108 describe that a novel broadband near-infrared (NIR) phosphor $LiInSi_2O_6:Cr^{3+}$ ($LIS:Cr^{3+}$) is successfully synthesized via solid-state reaction. Its crystal structure, photoluminescence properties as well as the application in NIR phosphor-converted LEDs (pc-LEDs) are explored. The $LIS:Cr^{31}$ phosphor has two absorptions bands centered at ~460 and 670 nm, respectively. Under 460 nm excitation, it shows the broadband NIR emission peaking at ~840 nm with a full width at half maximum (FWHM) of ~143 nm. The optimum $Cr^{3+}$ concentration is found to be ~6 mol %, whereas the intensity decrease at further increased $Cr^{3+}$ content is attributed to the radiative energy transfer process. The $LIS:0.06Cr^{3+}$ phosphor has a quantum yield of ~75% and can retain ~77% of the initial intensity at 150° C.

Highly efficient, thermally stable and broad NIR emissions of $LIS:Cr^{31}$ phosphors are caused by the $Cr^{3+}$ preferential occupancy in $[InO_6]$ octahedron with weak crystal field but relatively strong rigidity. The NIR pc-LED is fabricated by combining the $LIS:Cr^{31}$ phosphor with the blue LED chip, which has the NIR output power of ~51.6 mW and the photoelectric efficiency of ~17.8% at 100 mA drive current. The results suggest that $LIS:Cr^{31}$ phosphors have great potential for applications in broadband NIR pc-LEDs.

SUMMARY OF THE INVENTION

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

It appears desirable to provide a luminescent material (herein also indicated as "phosphor") having a relative broad band emission. Prior art phosphors do not always have this feature. Further, it is desirable that the luminescent material is thermally and chemically stable. However, some phosphors of the prior art are known to have a relatively low quenching temperature and/or to be relatively chemically unstable, such as towards moisture and/or air. Hence, amongst others, it is an object of the present invention to overcome or substantially ameliorate one or more of the disadvantages of prior art, or at least to provide a useful alternative.

Amongst others, a luminescent material is proposed, especially of the pyroxene type, according to the formula $E_{1-w}Sc_{1-x-y-u-w}M_yZ_uA_{2w}Si_{2-z-u}Ge_zAl_uO:Cr_x$, such as one or more of $LiSc_{1-x-y}Lu_ySi_2O_6:Cr_x$, $LiSc_{1-x-y}(Lu,Al)_ySi_2O_6:Cr_x$, and $Li_{1-w}Sc_{1-x-w}Mg_{2w}Si_2O_6:Cr_x$, wherein $Cr^{3+}$ substitutes for the octahedrally coordinated Sc and/or M atoms, such as Lu and/or Al, and emits in the 700-1100 nm spectral range. Another example of such luminescent material is $LiSc_{1-x}Si_2O_6:Cr_x$. In case M is chosen from the group consisting of Al and Ga (shorter average bond lengths to O compared to Sc), it is expected that the emission of $Cr^{3+}$ is shifted to shorter wavelengths while the emission should be shifted to longer wavelengths if M is chosen from the group consisting of In and Lu (longer average bond lengths to O compared to Sc). The emission band shape and position can thus be adjusted by changing the Sc and M atom ratio. Part of the Li and Sc+M atoms can be replaced by A atoms, such as Mg. Mg incorporation may lead to a red shift and broadening of the emission band. For larger Mg concentrations such as w≥0.5 a shift of the emission band maximum to shorter wavelengths is taking place that is caused by a structural change from the clinopyroxene to the orthopyroxene structure type. The same behavior is expected for A=Zn due to the chemical similarity of Zn and Mg. The incorporation of Ni as A atom may lead to additional emission in the 1100-1700 nm spectral range which is caused by Ni(II) on the octahedral pyroxene lattice sites.

Hence, in an aspect the invention provide a luminescent material (herein also indicated as "first luminescent material") comprising $E_{1-w}Sc_{1-x-y-u-w}M_yZ_uA_{2w}Si_{2-z-u}Ge_zAl_uO:Cr_x$. In embodiments, E may comprise one or more of Li, Na, and K. Further, in embodiments M may comprise one or more of Al, Ga, In, Tm, Yb, and Lu. Yet further, in embodiments Z may comprise one or more of Ti, Zr, and Hf In yet further embodiments, A may comprise one or more of Mg, Zn, and Ni. In embodiments, 0<x≤0.25. Further, in embodiments 0≤y≤0.75. Also, in yet further embodiments 0≤z≤2. Yet, in further embodiments 0≤u≤1. In embodiments, 0≤w≤1. Especially, in embodiments x+y+u+w≤1. Further, especially z+u≤2. Herein, the luminescent material $E_{1-w}Sc_{1-x-y-u-w}M_yZ_uA_{2w}Si_{2-z-u}Ge_zAl_uO_6:Cr_x$, is also indicated as the "luminescent material according to the formula" (i.e. complying with $E_{1-w}Sc_{1-x-y-u-w}M_yZ_uA_{2w}Si_{2-z-u}Ge_zAl_uO_6:Cr_x$), and similar phrases.

Compared to other broad band long wavelength/infrared phosphors known in the art, these phosphors appear to be relatively stable, also against acids and/or have a relatively high quenching temperature. Further, the quantum efficiency (QE) appears surprisingly high. Comparable phosphors may have quantum efficiencies below about 30%, whereas luminescent materials according to the above formula can well have quantum efficiencies of over 40%, even over 60%, such as even over 70%, like in specific embodiments even at least 80% (see also below). Further, the luminescence of the herein described materials may be relatively broad (large full width half maximum (FWHM)). Further, it appears that in embodiments the luminescent material may even have spectral power (even) in the 1050-1100 nm wavelength range. In embodiments, the luminescent material may especially be combined with a shorter wavelength emitting IR phosphor and a blue emitting pump LED to provide a broadband NIR pcLED that emits in about the 600-1100 nm wavelength range with a relatively high efficiency (see also below).

Below, some embodiments are described.

The luminescent material comprises $Cr^{3+}$ as broad band emitter. Especially, in the herein described luminescent materials, trivalent chromium is excitable in the blue, such as at one or more wavelengths selected from the wavelength range of 440-495 nm. Alternatively or additionally, in the herein described luminescent materials, trivalent chromium is excitable in the UV, such as at one or more wavelengths selected from the wavelength range of 380-440 nm. Hence, in embodiments the luminescent material may be excitable with first light, such as blue and/or UV radiation, especially in embodiments with blue light.

Further, it appears that the herein described luminescent materials may have centroid wavelength selected from the wavelength range of 850-900 nm, especially selected from the wavelength range of 860-890 nm. However, other (centroid) wavelengths are not excluded. The term "centroid wavelength" is known in the art, and may especially refer to the wavelength value where half of the light energy is at shorter and half the energy is at longer wavelengths; the value is stated in nanometers (nm). It is a spectral average of the intensity over the wavelength ($\Sigma \lambda * I_\lambda/(\Sigma I)$; i.e. the integration of the intensity over the emission band normalized to the integrated intensity). Centroid wavelength and full width half maximum (FWHM) are, as usual, determined at room temperature (especially 20° C.) of the respective luminescent material. Further, it appears that the herein described luminescent materials may have full width half maximum (FWHM) selected from the range of about 140-200 nm, such as selected from the range of about 150-190 nm. FWHM values of 170 and high quantum efficiencies may be obtained with the luminescent materials described herein. In embodiments, the luminescent material may emit light having a peak wavelength in a range of 700 nm to 1100 nm.

As indicated above, the luminescent material especially comprises $E_{1-w}Sc_{1-x-y-u-w}M_yZ_uA_{2w}Si_{2-z-u}Ge_zAl_uO_6:Cr_x$. As will be indicated below, more than one luminescent material may be applied. Further, the term "luminescent material" may also refer to a plurality of different luminescent materials complying with the formula $E_{1-w}Sc_{1-x-y-u-w}M_yZ_uA_{2w}Si_{2-z-u}Ge_zAl_uO_6:Cr_x$. Hence, in embodiments the term luminescent material may refer to a combination of materials, such as a composition of materials, or a multi-layer of materials, essentially consisting of two or more materials each complying with the formula $(E_{1-w}Sc_{1-x-y-u-w}M_yZ_uA_{2w}Si_{2-z-u}Ge_zAl_uO_6:Cr_x)$ as described herein.

Here below, this luminescent material is further explained in relation to a single luminescent material according to the formula $E_{1-w}Sc_{1-x-y-u-w}M_yZ_uA_{2w}Si_{2-z-u}Ge_zAl_uO_6:Cr_x$. However, as is clear from the above, different embodiments of the luminescent material may be combined.

Such luminescent material (according to the formula) may especially comprise one or more of Sc, Al, Ga, In, Tm, Yb, and Lu. Trivalent chromium ($Cr^{3+}$) may replace a part of the total number of atoms of the available one or more of Sc, Al, Ga, In, Tm, Yb, and Lu, especially at least part of Sc. In embodiments $0<x\leq0.25$. In view of the QE, the x-value may especially be equal to or below about 0.1. Hence, in specific embodiments $0.01\leq x\leq0.1$. Especially, x is at least about 0.025 in view of output of the luminescent material. In yet further specific embodiments, x is selected from the range of 0.04-0.07.

Especially, the luminescent material comprises from the group of Sc, Al, Ga, In, Tm, Yb, and Lu, at least one or more of Sc and Lu. Alternatively or additionally, Al may be available. Hence, in specific embodiments the luminescent material comprises from the group of Sc, Al, Ga, In, Tm, Yb, and Lu, at least one or more of Sc, Lu and Al. Hence, in specific embodiments, from the group of Sc, Al, Ga, In, Tm, Yb, and Lu, essentially only one or more of Sc, Al and Lu are available. Especially, at least Sc may be available.

Good results were obtained in embodiments with Sc and in other embodiments with Sc+Lu. Hence, especially the luminescent material according to the formula comprises one or more of Sc and Lu. Further, in embodiments the number of atoms Sc+Lu>Al+Ga+In+Tm+Yb. Here, this latter formula refers to both embodiments where only Sc may be available and embodiments where Sc+Lu is available. Especially, in embodiments (Al+Ga+In+Tm+Yb)/(Sc+Lu)<1.3, more especially (Al+Ga+In+Tm+Yb)/(Sc+Lu)<0.9, even more especially (Al+Ga+In+Tm+Yb)/(Sc+Lu)<0.8. Yet further, in (alternative) specific embodiments (Al+Ga+In+Tm+Yb+Lu)/(Sc)<3.2, even more especially (Al+Ga+In+Tm+Yb+Lu)/(Sc)<1.5, yet even more especially (Al+Ga+In+Tm+Yb+Lu)/(Sc)<0.5.

Hence, as is clear from the above, M may or may not be available (i.e. y may not be zero or may be zero), but good results are obtained when M comprises at least Lu. As indicated above, in embodiments M comprises one or more of Al, Ga, In, Tm, Yb, and Lu. Further, good results were obtained with $0\leq y\leq0.75$, especially in embodiments $0\leq y\leq0.50$, such as even more especially $0\leq y\leq0.2$. Hence, in embodiments y=0, and in other embodiments y>0.

Therefore, in specific embodiments M may be available, especially (though in embodiments not exclusively) as Lu. In such embodiments, especially $0.02\leq y\leq0.2$, even more especially $0.05\leq y\leq0.1$. With such ranges, good QEs may be obtained. Therefore, in specific embodiments M comprises Lu, even more especially M essentially consists of Lu, and $0.02\leq y\leq0.2$.

The element E may or may not be available. Hence, in embodiments $0\leq w\leq1$. Especially, in embodiments E comprises one or more of Li, Na, and K. When E is available, good results were obtained when E at least comprises Li. Especially, when E is available, E essentially consists of Li. Hence, in embodiments E at least comprises Li. Especially, in embodiments (Na+K)/Li<0.5, even more especially (Na+K)/Li<0.1, yet even more especially (Na+K)/Li<0.05. Good results were obtained when w=0 or when $w\neq0$ then w<1, such as $w\leq0.5$ (see also below in relation to A). Therefore, in specific embodiments E is available and essentially only consists of Li.

The luminescent material according to the formula may comprise one or more of Si, Ti, Zr, and Hf (and Ge, see also below). Or, in other words, luminescent material according to the formula may comprise one or more of Si and Z. As indicated above, Z comprises one or more of Ti, Zr, and Hf. Z may or may not be available. Hence, in embodiments $0 \leq u \leq 1$. When $u>0$, Z is available. Good results were obtained when Z at least comprises Zr. Hence, in embodiments Z at least comprises Zr. Further, in embodiments $0 \leq u \leq 0.25$. Larger values of u may be less desirable in view of e.g. QE and/or may be more difficult to form. Especially, when Z is available, Z may essentially consist of Zr and $0 \leq u \leq 0.25$.

Further, as indicated above one or more of Si and Ge may be available. Therefore, in embodiments $0 \leq z \leq 2$. In view of the quantum efficiency, it appears that in general the luminescent materials with a larger Si atom content than Ge content are better. Hence, in embodiments $0 \leq z \leq 0.05$. In yet more specific embodiment, $z=0$. In embodiments, $z+u \leq 2$. When $z=0$ and $u=0$, the luminescent material according to the formula is essentially a silicate.

Especially, in embodiments (Ti+Zr+Hf)/Si<0.2, even more especially (Ti+Zr+Hf)/Si<0.1, yet even more especially (Ti+Zr+Hf)/Si<0.05. Note that Ti, Zr, Hf may be incorporated on the octahedral sites for Sc and Ge may be incorporated on the tetrahedral sites for Si. As indicated above, in specific embodiments in embodiments $0 \leq u \leq 0.25$.

Part of the above-mentioned Sc and/or M atoms may be replaced by E+A atoms. As indicated above, in embodiments E comprises one or more of Li, Na, and K. Further, in embodiments A comprises one or more of Mg, Zn, and Ni. A may thus be available in the luminescent material according to the formula or may not be available. Hence, in embodiments $w=0$ and in other embodiments $w>0$. Especially, in embodiments $0 \leq w \leq 0.5$. Larger values of w may be less desirable in view of emission peak position and spectral width but may show a cost advantage over materials with lower w. Good results were obtained when A at least comprises Mg. Therefore in embodiments A at least comprises Mg. Hence, in further specific embodiments, wherein A is available, A may essentially consist of Mg. Hence, in specific embodiments A is available and may essentially consist of Mg, with even more especially $0 \leq w \leq 0.5$ (see further also below).

Mg incorporation may lead to a red shift and broadening of the emission band. For larger Mg concentrations, such as $w \geq 0.5$, a shift of the emission band maximum to shorter wavelengths is taking place that may be caused by a structural change from the clinopyroxene to the orthopyroxene structure type. Especially interesting for the application of these phosphors appear composition according to the formula with w values in the range $0.1 \leq w \leq 0.4$, because some structural disorder is being observed that surprisingly turned out to be beneficial for the application (broadened emission spectrum and high quantum efficiency). The structural disorder can be analyzed by means of X-ray diffraction. While the crystallographic b and c axis shorten with increasing w while the average distance between the layers of chains of edge-sharing octahedra lying in the planes are getting larger. The layer spacing corresponds to $a_{orthopyroxene}/4$ or $\sin(\beta)$ $a_{clinopyroxene}/2$. The degree of disorder can be influenced by the processing parameters such as firing temperature, firing time or for example heating and cooling rates. A lower firing temperature can for example be used if a fluxing agent is being added to the firing mixture.

XRD results indicate that powder samples with compositions in-between those of the boundary phases $LiScSi_2O_6$ (clinopyroxene structure type) and $Li_{0.5}Sc_{0.5}MgSi_2O_6$ (orthopyroxene structure types) show stacking disorder along the [100] direction with sequences belonging to either the clinopyroxene or orthopyroxene structure type.

The disorder leads to an increase of the average layer thickness. While b and c axis shorten with higher w parameter, the intralayer distance increases. With $a_{orthopyroxene}=2 \sin \beta * a_{clinopyroxene}$ the change of average cell dimensions as function of Mg content is given in Table 1 below.

TABLE 1

| w | $a_0/4 = \sin(\beta * a_m/2$ [Å] | b [Å] | c [Å] |
|---|---|---|---|
| 0 | 4.588 | 8.926 | 5.352 |
| 0.1 | 4.594 | 8.912 | 5.342 |
| 0.25 | 4.594 | 8.895 | 5.323 |
| 0.35 | 4.586 | 8.871 | 5.309 |
| 0.5 | 4.585 | 8.834 | 5.302 |

Further, in embodiments (in view of stoichiometry) $x+y+u+w \leq 1$. Yet further, $x+y+u+w>0$, as already x may be larger than 0.

Referring to $E_{1-w}Sc_{1-x-y-u-w}M_yZ_uA_{2w}Si_{2-z-u}Ge_zAl_uO_6$:$Cr_x$, it appeared that Mg may (advantageously) broaden the spectrum, (essentially) without lowering QE. Further, it appeared that a partial replacement of Li and Sc by Mg is still processable. $Ni^{2+}$ may show (SWIR) emission >1600 nm when incorporated on the octahedral site. $Zn^{2+}$ might be used instead of $Mg^{2+}$ (or in addition to $Mg^{2+}$). However, Mg may lead to a higher QE than Zn. Li variants seem to be more stable than K or Na variants. Hence, (Na+K)<Li (see also above). Especially, (Na+K)/Li<0.1, more especially (Na+K)/Li=0. Li variants may also provide a higher QE than Na and/or K variants. Availability of Lu may have an advantageous effect on the QE and or efficiency compared to inclusion of In. Ge may be used to tune the emission characteristics, but the content of Ge may be relatively low in view of QE. Especially, Ge<Si, even more especially Ge/Si<0.05, yet even more especially Ge/Si=0.

In specific embodiments of the luminescent material, E at least comprises Li; M at least comprises Lu and/or A at least comprises Mg; $0.01 \leq x \leq 0.1$; $0 \leq y \leq 0.2$; and $0 \leq z \leq 0.5$. Such luminescent materials appear to provide relatively high QEs. Further, band widths and centroid wavelengths of such luminescent materials are useful. Also the stability against chemical attack such as mineral acids or hot water vapor appeared to be relatively high and thermal quenching of emission appeared to be relatively low (i.e. high quench temperature).

As indicated above, especially good results were obtained with embodiments wherein the luminescent material comprises one or more of $LiSc_{1-x-y}Lu_ySi_2O_6$:$Cr_x$, $LiSc_{1-x-y}(Lu,Al)_ySi_2O_6$:$Cr_x$, and $Li_{1-w}Sc_{1-x-w}Mg_{2w}Si_2O_6$:$Cr_x$. Other combinations of luminescent materials according to the formula may also be possible.

Herein, terms like "Lu,Al", and similar terms, such as "Al, Ga, Sc" indicate that one or more of the indicate elements may be selected. Hence, "Lu,Al" may refer to Lu, to Al, or to both Lu and Al. Similarly this may apply to similar terms.

Amongst others, the present invention provides novel pyroxene type phosphors that are characterized by broad spectra in the IR spectral range that enable the production of phosphor converted LEDs comprising these phosphors and show superior emission properties for e.g. IR spectroscopy and hyperspectral imaging applications. Further, amongst others the present invention provides chemically stable pyroxene type phosphors that can e.g. be washed with diluted mineral acids to increase performance and improve reliability. To this end—amongst others—Li containing pyroxene type phosphors are being disclosed.

In yet a further aspect, the invention also provides a luminescent material composition, including one or more luminescent materials according to the herein described formula as well as one or more other luminescent materials ("second luminescent material"). Especially, the luminescent materials are chosen such, that both types of luminescent material are both excitable at least one wavelength, such at least both being excitable at one or more wavelengths in the blue wavelength range.

As indicated above, the term "luminescent material" may in specific embodiments also refer to a combination of two or more luminescent material according to the formula indicated above. When using different luminescent materials, the spectral power distribution of the luminescence can be broadened. This may be useful for applications (see also below). As indicated above, in embodiments the luminescent material may be provided as a combination of materials, such as a composition of materials, or a multi-layer of materials, essentially consisting of two or more materials each complying with the formula $(E_{1-w}Sc_{1-x-y-u-w}M_yZ_uA_{2w}Si_{2-z-u}Ge_zAl_uO_6:Cr_x)$ as described herein.

Alternatively or additionally, a second luminescent material may be applied (not conform the formula). Also in this way the spectral power distribution of the luminescence can be broadened, such as to shorter wavelengths (e.g. red) and/or to larger wavelengths (IR). Hence in an aspect the invention also provides a luminescent material composition comprising (a) the luminescent material ("first luminescent material") as defined herein and (b) a second luminescent material. Especially, the luminescent material is excitable with first light, such as blue and/or UV radiation. Further, especially the luminescent material is configured to provide first luminescence upon irradiation with the first light. Especially, in embodiments the second luminescent material is configured to provide second luminescence (also) upon irradiation with the first light. Further, especially in embodiments the luminescent material and the second luminescent material are configured to provide first and second luminescence in one or more of the red and infrared wavelength ranges. Yet further, in specific embodiments the first and second luminescence have different centroid wavelengths $(\lambda_1,\lambda_2)$. Hence, the spectral power distribution of the emission of such luminescent material composition may be broadened relative to the spectral power distribution of the emission of a single luminescent material according to the formula. Hence, in specific embodiments the invention also provides a luminescent material composition comprising (a) the luminescent material according to any one of the preceding claims and (b) a second luminescent material; wherein the luminescent material is excitable with first light, wherein the luminescent material is configured to provide first luminescence upon irradiation with the first light, wherein the second luminescent material is configured to provide second luminescence upon irradiation with the first light, wherein the luminescent material and the second luminescent material are configured to provide first and second luminescence in one or more of the red and infrared wavelength ranges, and wherein the first and second luminescence have different centroid wavelengths $(\lambda_1,\lambda_2)$.

The different luminescent materials may not only be provided as composition, but may also be provided as multi-layer, such as two or more layers, of which at least two have different composition, and of which one of these at least two may comprise the first luminescent material and less or no second luminescent material, and of which another one of these at least two may comprise the second luminescent material and less or no first luminescent material. Further, different luminescent materials may also be provided at different locations in a light device (see further below).

Further, in specific embodiments the first luminescent material and second luminescent materials are chosen such that the spectral power distributions of the emissions in the red and/or infrared (spectrally) overlap. Further, especially the emission of the second luminescent material (in the red and/or infrared) is a broad band emission, such as an emission having a FWHM of at least 100 nm.

In embodiments, the (first) luminescent material may also be indicated as "NIR phosphor", as the (first) luminescent material may especially be configured to have one or more emission wavelengths in the range of 700-1100 nm. Further, the second luminescent material may be indicated as "second phosphor". The second phosphor may be configured to have one or more emission wavelengths in the red and/or NIR. The term "NIR" may especially refer to the 700-1100 nm wavelength range. Hence, the term NIR may also refer to some red hues.

Especially, the second luminescent material may be a luminescent material that emits at least in the NIR, such as at one or more wavelengths selected from the wavelength range of 620-780 nm, such as especially selected from the wavelength range of 620-750 nm.

A suitable luminescent material may be $RE_3Ga_{5-x-y}A_xSiO_{14}:Cr_y$ (RE=La, Nd, Gd, Yb, Tm; A=Al, Sc), wherein $0 \le x \le 1$ and $0.005 \le y \le 0.1$. These luminescent materials show strong emission in the wavelength range >900 nm and can thus enhance the spectral power distribution at longer wavelengths in the 900-1100 nm range. Alternatively or additionally, a suitable luminescent material may be $Gd_{3-x}RE_xSc_{2-y-z}Ln_yGa_{3-w}Al_wO_{12}:Cr_z$ (Ln=Lu, Y, Yb, Tm; RE=La, Nd), wherein $0<x\le3$; $0\le y\le1.5$; $0\le z\le0.3$; and $0\le w\le2$. These luminescence materials show strong emission in the wavelength range <800 nm and can thus enhance the spectral power distribution in the 700-850 nm wavelength range. Alternatively or additionally, a suitable luminescent material may be $AAEM_{1-x}F_6:Cr_x$ (A=Li, Cu; AE=Sr, Ca; M=Al, Ga, Sc), wherein $0.005 \le x \le 0.2$. Alternatively or additionally, a suitable luminescent material may be $A_{2-x}(WO_4)_3:Cr_x$ (A=Al, Ga, Sc, Lu, Yb), wherein $0.003<x\le0.5$. Alternatively or additionally, a suitable luminescent material may be $Sc_{1-x-y}A_yMO:Cr_x$, wherein $MO=BO_3$, or $MO=P_3O_9$, or $MO=(BP_3O_{12})_{0.5}$, or $MO=(SiP_5O_{19})_{0.34}$, with A=Lu, In, Yb, Tm, Y, Ga, Al, wherein $0<x\le0.25$, $0\le y\le1$.

Alternatively or additionally, a suitable luminescent material may be $M_{2-x}Si_{5-y}Al_yO_xN_{8-y}:Eu_x$ (M=Ba, Sr, Ca), wherein $0<x\le0.05$, $0\le y\le0.1$. Alternatively or additionally, a suitable luminescent material may be $M_{1-x}SiAlN_3:Eu_x$ (M=Sr, Ca), wherein $0<x\le0.03$. Alternatively or additionally, a suitable luminescent material may be $M_{1-x}LiAl_3N_4:Eu_x$ (M=Ba, Sr, Ca), wherein $0<x\le0.02$. These red emitting materials can further excite the Cr(III) activator ions in the first luminescent materials and therefore improve luminescence conversion efficiency. They also can broaden the composed phosphor emission spectrum in the 620-780 nm range.

Hence, in embodiments the second luminescent material may comprise one or more of: (i) $RE_3Ga_{5-x-y}A_xSiO_{14}:Cr_y$ (RE=La, Nd, Gd, Yb, Tm; A=Al, Sc), wherein $0 \le x \le 1$ and $0.005 \le y \le 0.1$; (ii) $Gd_{3-x}RE_xSc_{2-y-z}Ln_yGa_{3-w}Al_wO_{12}:Cr_z$ (Ln=Lu, Y, Yb, Tm; RE=La, Nd, Lu), wherein $0 \le x \le 3$; $0 \le y \le 1.5$; $0 \le z \le 0.3$; and $0 \le w \le 2$; (iii) $AAEM_{1-x}F_6:Cr_x$ (A=Li, Cu; AE=Sr, Ca; M=Al, Ga, Sc), wherein $0.005 \le x \le 0.2$; (iv) $A_{2-x}(WO_4)_3:Cr_x$ (A=Al, Ga, Sc, Lu, Yb), wherein $0.003<x\le0.5$; (v) $Sc_{1-x-y}A_yMO:Cr_x$, wherein $MO=BO_3$, or MO=$P_3O_9$, or MO=$(BP_3O_{12})_{0.5}$, or MO=$(SiP_5O_{19})_{0.34}$, with A=Lu, In, Yb, Tm, Y, Ga, Al, wherein $0<x\le0.75$, $0\le y\le1$; (vi) $M_{2-x}Si_{5-y}Al_yO_yN_{8-y}$:Eu$_x$ (M=Ba, Sr, Ca), wherein $0<x\le0.05$, $0\le y\le0.1$; (vii) $M_{1-x}SiAlN_3$:Eu$_x$ (M=Sr, Ca), wherein $0<x\le0.03$; and (viii) $M_{1-x}LiAl_3N_4$:Eu$_x$ (M=Ba, Sr, Ca), wherein $0<x\le0.02$.

An especially suitable material appears to be a Gd and/or Sc based garnet with chromium. This material has a relatively high thermal quenching and a relatively high quantum efficiency. Further, the spectral power distribution of the emission may (only) partly overlap with the spectral power distribution of the emission of the first luminescent material as described herein. Hence, in embodiments the second luminescent material comprises $Gd_{3-x}RE_xSc_{2-y-z}Ln_yGa_{3-w}Al_wO_{12}$:Cr$_z$ (Ln=Lu, Y, Yb, Tm; RE=La, Nd, Lu), wherein $0\le x\le3$; $0\le y\le1.5$; $0\le z\le0.3$; and $0\le w\le2$. Especially $0<x\le1$ and RE=La, Lu, $0\le y\le0.5$ and Ln=Lu, $0.04\le z\le0.16$ and $0\le w\le1$. Even more especially is $0.05<x\le0.2$ and RE=Lu, $0.1\le y\le0.3$ and Ln=Lu, $0.06\le z\le0.12$ and $0\le w\le0.04$.

The luminescent material and/or luminescent material composition may be used to generate light in the red and/or infrared. To this end, a device may be provided comprising a light source (herein also indicated as first light source), wherein the (first) luminescent is configured to convert at least part of the first light, generated by the first light source, into first luminescence. As indicated above, the first luminescence may have centroid wavelength selected from the wavelength range of 850-900 nm, especially selected from the wavelength range of 860-890 nm. Further, the first luminescence may have full width half maximum (FWHM) selected from the range of about 140-200 nm. In embodiments, the luminescent material may emit light having a peak wavelength in a range of 700 nm to 1100 nm. Especially, the light source comprises a solid state light source, like a LED (light emitting device).

Hence, in yet a further aspect the invention provides a device comprising (a) a first light source configured to generate first light, and (b) the luminescent material as defined herein, wherein the luminescent material is configured to convert at least part of the first light in first luminescence. In specific embodiments, the luminescent material may be configured to essentially convert all the first light source light (at least partly) into first luminescence. In such embodiments, there may essentially not remain any first light.

Of course, also the luminescent material composition may be applied. In such embodiments, the first light source may be used to excite the first luminescent material and the second luminescent material. Alternatively or additionally, the excitation spectrum of the second luminescent material may better match with another light source. Hence, optionally a second light source may be applied configured to excite at least the second luminescent material. In such embodiments, the second light source may be configured to generate second light that has another spectral power distribution than the first light of the first light source.

Note that the term "first light source" may also refer to a plurality of first light sources (which may all essentially be of the same type, such as especially of the same bin). Note that the term "second light source" may also refer to a plurality of different first light sources (which may be of different types, such as of different bins).

Especially, the light source(s) indicated herein are solid state light sources, such as LEDs.

Hence, in embodiments the device may comprise (i) the second luminescent material as; and (ii) optionally a second light source configured to generate second light; wherein the second luminescent material is configured to convert one or more of (a) part of the second light and (b) at least part of the optional second light into second luminescence.

Especially good results may be obtained when the first luminescent material comprises one or more of $LiSc_{1-x-y}Lu_ySi_2O_6$:Cr$_x$, $LiSc_{1-x-y}(Lu,Al)_ySi_2O_6$:Cr$_x$, and $Li_{1-w}Sc_{1-x-w}Mg_{2w}Si_2O_6$:Cr$_x$, and when the second luminescent material comprises $Gd_{3-x}RE_xSc_{2-y-z}Ln_yGa_{3-w}Al_wO_{12}$:Cr$_z$ (Ln=Lu, Y, Yb, Tm; RE=La, Nd), wherein $0\le x\le3$; $0\le y\le1.5$; $0\le z\le0.3$; and $0\le w\le2$.

Further, the term "second luminescent material" may also refer to a plurality of different second luminescent materials (e.g. emitting at different wavelengths).

The device may be used to irradiate a material or a product. The red and/or infrared light may be used for different purposes. A purpose may be to detect specific species, which may absorb and/or convert into radiation the luminescence of the first luminescent material (and the optional second luminescent material). For instance, in embodiments the device may be used to irradiate human tissue such as for detecting tumor tissue. Further, in embodiments the device may be used to detect e.g. foodstuff ingredients such as sugars, carbohydrates, proteins or fat, etc. Therefore, in specific embodiments the device may also comprise a sensor. Hence, the invention also provides in embodiments the device as described herein further comprising an optical sensor configured to detect radiation in one or more of the red and infrared wavelength ranges. Sensing may be done in a transmissive mode or in a reflective mode.

In specific embodiments, the device may be used for, or may be configured for, hyperspectral imaging.

Hence, in an aspect the invention also provides a wavelength converting structure comprising the first luminescent material and a first light course. Hence, in embodiments, the wavelength converting structure further comprising a light source emitting a first light, the wavelength converting structure disposed in a path of the first light, wherein the NIR phosphor absorbs the first light and emits a second light, the second light having a wavelength range of 700 nm to 1100 nm.

In embodiments, the wavelength converting structure further comprising a second phosphor material, wherein the second phosphor material includes at least one of a green phosphor, a red phosphor, and an IR phosphor.

Instead of the term "luminescent material" also the term "phosphor material" may be applied. The phosphor may comprise a combination of two or more of the herein described phosphors. Two phosphors having the same general formula, but having a different compositions. This may lead to different spectral power distributions.

BRIEF DESCRIPTION OF THE DRAWINGS

FIGS. 9a-9d show some results, wherein: FIG. 9a shows Emission spectra (443 nm excitation) of example 2; FIG. 9b: Emission spectra (443 nm excitation) of example 3; FIG. 9c shows an emission spectrum of NIR pcLED of example 4; and FIG. 9d: Simulated emission spectrum of a phosphor converted LED comprising a 450 nm pump LED and a phosphor mixture comprising $Y_3Al_5O_{12}$:Ce, $CaAlSiN_3$:Eu, $(Gd,Lu)_3Sc_2Ga_3O_{12}$:Cr and $Li_{0.9}Sc_{0.85}Mg_{0.2}Si_2O_6$:$Cr_{0.05}$.

Schematic drawings are not necessarily to scale.

DETAILED DESCRIPTION

This specification discloses luminescent materials that are phosphors that can emit near-infrared (NIR) radiation, and devices that include a wavelength converting structure formed from the luminescent materials that are phosphors that can emit NIR radiation. The luminescent materials that are phosphors that can emit NTR radiation may be referred to herein as "NIR phosphors," "NIR phosphor materials," and/or "NIR phosphor compositions." For economy of language, infrared rations may be referred to herein as "light."

The luminescent materials are NIR emitting broadband phosphors that can enable pc LED light sources that have improved spectral shapes and light output levels. Higher light output levels are advantageous for many applications, including e.g., spectroscopy applications because they provide an improved signal-to-noise ratio resulting in more accurate and faster analysis.

In general, Cr(III) doped phosphors are suitable down-conversion materials for pcLEDs that emit in the NIR region ("pc-NIR LEDs") because of the relatively intense absorption bands in the blue to red spectral range and the large Stokes shift that leads to broad band emission in the NIR spectral range. While Cr(III) is often incorporated on octahedral Ga(III) sites in the host lattices, for example gallium garnet phosphors like $Gd_3Ga_5O_{12}$:Cr or in $La_3(Ga,Al)_5(Ge,Si)O_{14}$:Cr type phosphors, incorporation on larger octahedral Sc(III) can further shift the broadband Cr(III) emission towards longer wavelengths. Note that ":Cr" refers to a system doped with trivalent chromium. Further, that ":Ce" refers to a system doped with trivalent cerium. Yet further, note that ":Eu" refers to a system doped with divalent europium.

To adjust the absorption and emission properties of the Cr(III) doped scandium silicates, phosphates, borates, borophosphates, and borosilicates, a portion of the Sc can either be replaced by larger sized trivalent Lu, In, Yb, Tm or Y to obtain a spectroscopic shift towards longer wavelength, or by smaller sized trivalent Ga or Al to induce a spectroscopic shift towards shorter wavelength. In this way, a broad coverage of the (NIR) emission wavelength range from 700-1200 nm can be obtained by combining the NIR phosphor materials with III-V type primary LEDs that show emission in the blue, cyan, green or red spectral range, and optionally by combining with the second luminescent material (see further also below).

Figure 1:
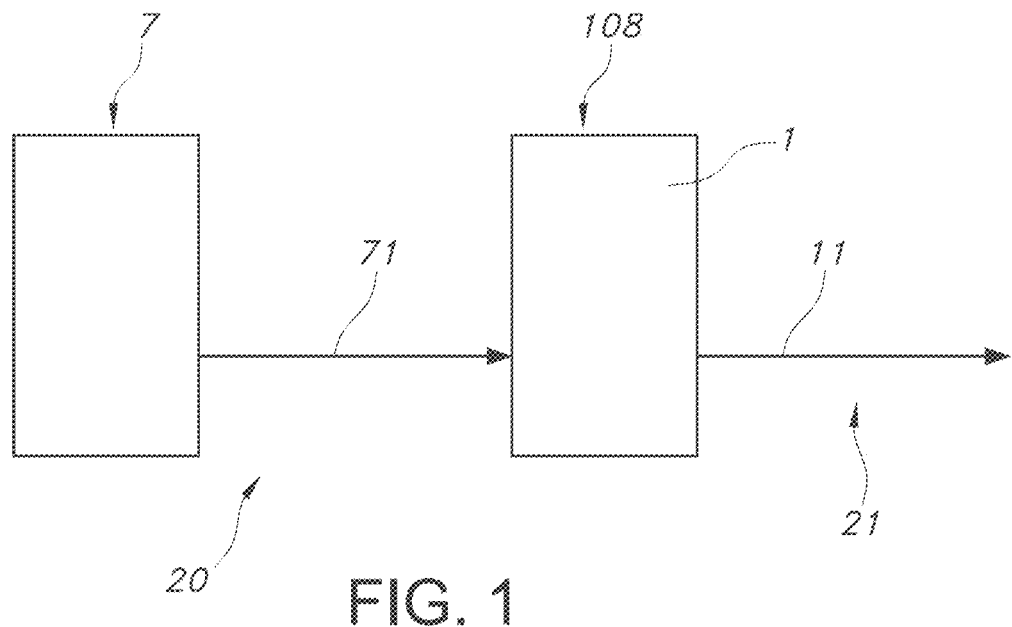
FIG. 1 illustrates an embodiment of a wavelength converting structure as part of an illumination device.

FIG. 1 illustrates a wavelength converting structure 108 that includes at least one of the disclosed luminescent NIR phosphor materials. Wavelength converting structure 108 is used in an illumination device 20. The light source 7 may be an LED or any other suitable source including, as examples, resonant cavity light emitting diodes (RCLEDs) and vertical cavity laser diodes (VCSELs). Light source 7 emits a first light 71. A portion of the first light 71 is incident upon a wavelength converting structure 108. The wavelength converting structure 108 absorbs the first light 71 and emits second light 11. The wavelength converting structure 108 may be structured such that little or no first light is part of the final emission spectrum from the device, though this is not required. Reference 21 refers to the light generated by the device 20. Especially, this (device) light 21 at least comprises the first luminescence. The first luminescence is based on conversion of at least part of the first light 71 from the light source 7. Optionally, the device light 21 may also comprise first light 71.

Due to the broad band absorbing nature in the visible spectral range that the disclosed NIR phosphor materials can be excited with, light source 7 may be, for example, blue, green or red emitting LEDs such as, for example, AlInGaN or AlInGaP or AlInGaAs LEDs.

Wavelength converting structure 108 may include, for example, one or more of the borate, phosphate, borophosphate, and silicophosphate NIR phosphor materials disclosed herein.

The wavelength converting structure 108 described with respect to FIG. 1 can be manufactured, for example, in powder form, in ceramic form, or in any other suitable form. The wavelength converting structure 108 may be formed into one or more structures that are formed separately from and can be handled separately from the light source, such as a prefabricated glass or ceramic tile, or may be formed into a structure that is formed in situ with the light source, such as a conformal or other coating formed on or above the source.

In some embodiments, the wavelength converting structure 108 may be powders that are dispersed for example in a transparent matrix, a glass matrix, a ceramic matrix, or any other suitable material or structure. NIR phosphor dispersed in a matrix may be, for example, singulated or formed into a tile that is disposed over a light source. The glass matrix may be for example a low melting glass with a softening point below 1000° C., or any other suitable glass or other transparent material. The ceramic matrix material can be for example a fluoride salt such as $CaF_2$ or any other suitable material.

The wavelength converting structure 108 may be used in powder form, for example by mixing the powder NIR phosphor with a transparent material such as silicone and dispensing or otherwise disposing it in a path of light. In powder form, the average particle size (for example, particle diameter) of the NIR phosphors may be at least 1 μm in some embodiments, no more than 50 μm in some embodiments, at least 5 μm in some embodiments, and no more than 20 μm in some embodiments. Individual NIR phosphor particles, or powder NIR phosphor layers, may be coated with one or more materials such as a silicate, a phosphate, and/or one or more oxides in some embodiments, for example to improve absorption and luminescence properties and/or to increase the material's functional lifetime.

Figure 2:
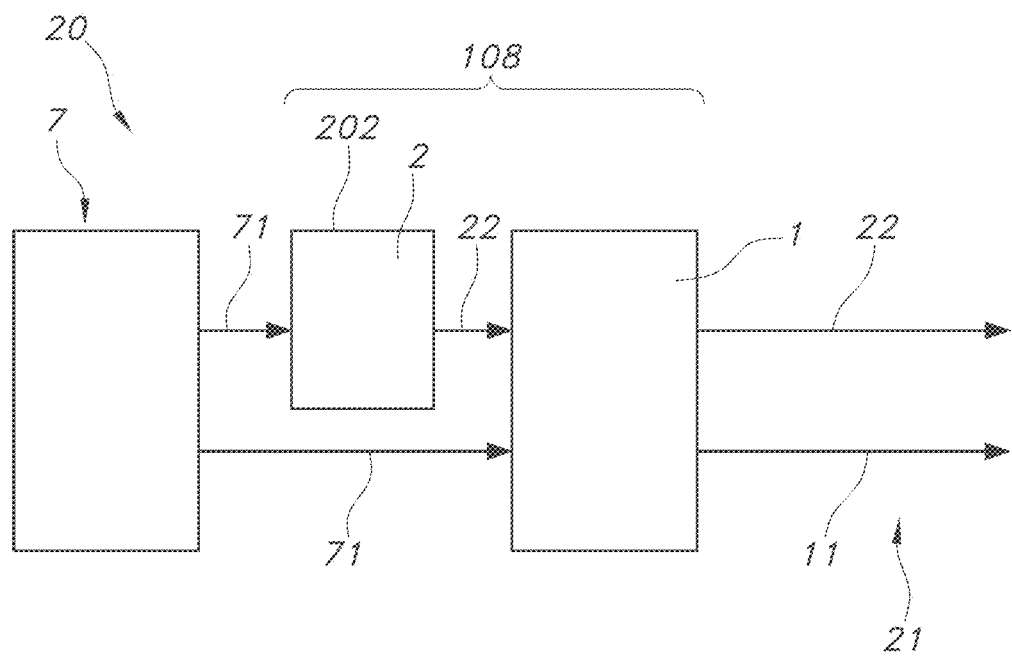
FIG. 2 illustrates another embodiment of a wavelength converting structure as part of an illumination device.

FIG. 2 illustrates another embodiment in which a wavelength converting structure including one or more of the disclosed NIR phosphor materials may further be combined with a second phosphor system. In FIG. 2, the wavelength converting structure 108 includes an NIR phosphor portion 208 and a second phosphor portion 202 as part of an illumination device 201. In FIG. 2, a light source 7 may be an LED or any other suitable source, (including as examples resonant cavity light emitting diodes (RCLEDs) and vertical cavity laser diodes (VCSELs). Light source 7 emits first light 71. First light 71 is incident upon wavelength converting structure 108, which includes an NTR phosphor portion 208 including one or more of the first luminescent materials 1 disclosed herein, and a second phosphor portion 202. The second phosphor portion comprises a second luminescent material 2, different from the first luminescent material. A portion of the first light 71 is incident on an NIR phosphor portion 208 of the wavelength converting structure 108. The NIR phosphor portion 208 absorbs the first light 71 and emits first luminescence 11. A portion of the first light 71 is incident on a second phosphor portion 202 of the wavelength converting structure 108. The second luminescent material 2 absorbs the first light 71 and emits second luminescence 22. Second luminescence 22 may be visible, though this is not required. The second luminescence 22 may in embodiments be incident on the NIR phosphor portion 208. The NIR phosphor 208 may absorbs all or a portion of the second luminescence 22 may transmit at least part of the second luminescence 22 and/or convert at least part of the second luminescence 22 into first luminescence 11.

The wavelength converting structure 108 including an NIR phosphor 208 and second phosphor 202 may be structured such that little or no first light 71 (and/or optionally little or no second luminescence 22) is part of the final emission spectrum from the device, though this is not required. The final device light is indicated with reference 21. The device light 21 may at least include first luminescence 11. The first luminescence 11 is based on conversion of at least part of the first light 71 from the light source 7 and/or of the second luminescence 22. Optionally, the device light 21 may also comprise first light 71. Further, the device light 21 may also comprise second luminescence 22. Herein, in this schematically depicted embodiment the second luminescence 22 is based on conversion of at least part of the first light 71 from the light source 7.

Due to the broad band absorbing nature in the visible spectral range that the disclosed NIR phosphor materials can be excited with, light source 7 may be, for example, blue, green or red emitting LEDs such as, for example, AlInGaN or AlInGaP or AlInGaAs LEDs.

The first luminescent material (NIR phosphor) 1 included in wavelength converting structure 108 may include one or more of the luminescent materials according to the formula disclosed herein.

Any suitable second phosphor may be used in the second luminescent material 2. In some embodiments, the second phosphor includes one or more of a green emitting phosphor, a red emitting phosphor and an IR emitting phosphor as disclosed below.

Examples of a green emitting phosphor for use as second luminescent material 2 may include $Sr_4Al_{14}O_{25}:Eu^{2+}$ and/or $A_3B_5O_{12}:Ce^{3+}$, where A is selected from the group Y, Tb, Gd, and Lu, where B is selected from the group Al, Sc and Ga. In particular, A may at least include one or more of Y and Lu, and B at least includes Al. These types of materials may give highest efficiencies. In an embodiment, the second phosphor includes at least two luminescent materials of the type of $A_3B_5O_{12}:Ce^{3+}$, where A is selected from the group Y and Lu, where B is selected from the group Al, and where the ratio Y:Lu differ for the at least two luminescent materials. For instance, one of them may be purely based on Y, such as $Y_3Al_5O_{12}:Ce^{3+}$, and one of them may be a Y,Lu based system, such as $(Y_{0.5}Lu_{0.5})_3Al_5O_{12}:Ce^{3+}$. Compositions of garnets especially include $A_3B_5O_{12}$ garnets, where A includes at least yttrium or lutetium and where B includes at least aluminum. Such garnet may be doped with cerium (Ce), with praseodymium (Pr) or a combination of cerium and praseodymium; especially however with Ce. Especially, B includes aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group yttrium (Y), gadolinium (Gd), terbium (Tb) and lutetium (Lu). Further, Gd and/or Tb are especially only present up to an amount of about 20% of A. In a specific embodiment, the garnet luminescent material includes $(Y_{1-x}Lu_x)_3Al_5O_{12}:Ce$, where x is equal to or larger than 0 and equal to or smaller than 1. The terms ":Ce" or ":Ce³⁺" (or similar terms), indicate that part of the metal ions (i.e. in the garnets: part of the "M" ions) in the luminescent material is replaced by Ce (or another luminescent species when the term(s) would indicate that, like ":Yb"). For instance, assuming $(Y_{1-x}Lu_x)_3Al_5O_{12}:Ce$, part of Y and/or Lu is replaced by Ce. This notation is known to the person skilled in the art. Ce will replace M in general for not more than 10%; in general, the Ce concentration will be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art.

Examples of a red emitting phosphor for use as second luminescent material 2 may include $(Ba,Sr,Ca)AlSiN_3:Eu$ and $(Ba,Sr,Ca)_2Si_{5-x}Al_xO_xN_{8-x}:Eu$: In these compounds, europium (Eu) is substantially or only divalent, and replaces one or more of the indicated divalent cations. In general, Eu will not be present in amounts larger than 10% of the cation, especially in the range of about 0.5-10%, more especially in the range of about 0.5-5% relative to the cation(s) it replaces. The term ":Eu" or ":Eu²⁺", indicates that part of the metal ions is replaced by Eu (in these examples by $Eu^{2+}$). For instance, assuming 2% Eu in $CaAlSiN_3:Eu$, the correct formula could be $(Ca_{0.98}Eu_{0.02})AlSiN_3$. Divalent europium will in general replace divalent cations, such as the above divalent alkaline earth cations, especially Ca, Sr or Ba.

Further, the material $(BaSrCa)_2Si_{5-x}Al_xO_xN_{8-x}:Eu$ can also be indicated as $M_2Si_{5-x}Al_xO_x N_{8-x}:Eu$, where M is one or more elements selected from the group barium (Ba), strontium (Sr) and calcium (Ca); especially, M includes in this compound Sr and/or Ba. In a further specific embodiment, M consists of Sr and/or Ba (not taking into account the presence of Eu), especially 50-100%, especially 50-90% Ba and 50-0%, especially 50-10% Sr, such as $Ba_{1.5}Sr_{0.5}Si_5N_8$:Eu, (i.e. 75% Ba; 25% Sr). Here, Eu is introduced and replaces at least part of M i.e. one or more of Ba, Sr, and Ca). Likewise, the material $(Sr,Ca,Mg)AlSiN_3:Eu$ can also be indicated as $MAlSiN_3:Eu$ where M is one or more elements selected from the group magnesium (Mg) strontium (Sr) and calcium (Ca); especially, M includes in this compound calcium or strontium, or calcium and strontium, more especially calcium. Here, Eu is introduced and replaces at least part of M (i.e. one or more of Mg, Sr, and Ca). Preferably, in an embodiment the first red luminescent material includes $(Ca,Sr,Mg)AlSiN_3:Eu$, preferably $CaAlSiN_3:Eu$. Further, in another embodiment, which may be combined with the former, the first red luminescent material includes $(Ca,Sr,Ba)_2Si_{5-x}Al_xO_xN_{8-x}:Eu$, preferably $(Sr,Ba)_2Si_5N_8:Eu$. The terms "(Ca,Sr,Ba)" indicate that the corresponding cation may be occupied by calcium, strontium or barium. It also indicates that in such material corresponding cation sites may be occupied with cations selected from the group calcium, strontium and barium. Thus, the material may for instance comprise calcium and strontium, or only strontium, etc.

Other red emitting luminescent materials are also described above.

Examples of an IR emitting phosphor for use as second luminescent material 2 may include langasite type phosphors of composition $RE_3Ga_{5-x-y}A_xSiO_{14}:Cr_y$ (RE=La, Nd, Gd, Yb, Tm; A=Al, Sc) and/or chromium doped garnets of composition $Gd_{3-x}RE_xSc_{2-y-z}Ln_yGa_{3-w}Al_wO_2:Cr_z$ (Ln=Lu, Y, Yb, Tm; RE=La, Nd), where $0 \le x \le 3$; $0 \le y \le 1.5$; $0 \le z \le 0.3$; and $0 \le w \le 2$, and/or one or more chromium doped colquiirite materials of composition $AAEM_{1-x}F_6:Cr_x$ (A=Li, Cu; AE=Sr, Ca; M=Al, Ga, Sc) where $0.005 \le x \le 0.2$, and/or one or more chromium doped tungstate materials of composition $A_{2-x}(WO_4)_3:Cr_x$ (A=Al, Ga, Sc, Lu, Yb) where $0.003 \le x \le 0.5$.

The wavelength converting structure 108 including the first luminescent material 1 and the second luminescent material 2 described with respect to FIG. 2 can be manufactured, for example, in powder form, in ceramic form, or in any other suitable form. The first luminescent material 1 and the second luminescent material 2 may be formed into one or more structures that are formed separately from and can be handled separately from the light source, such as a prefabricated glass or ceramic tile, or may be formed into a structure that is formed in situ with the light source, such as a conformal or other coating formed on or above the source.

The first luminescent material 1 and the second luminescent material 2 may be mixed together in a single wavelength converting layer, or formed as separate wavelength converting layers. In a wavelength converting structure with separate wavelength converting layers, first luminescent material 1 and the second luminescent material 2 may be stacked such that the luminescent material 5 may be disposed between the first luminescent material 1 and the light source, or the first luminescent material 1 may be disposed between the second luminescent material 2 and the light source.

In some embodiments, the first luminescent material 1 and the second luminescent material 2 may be powders that are dispersed for example in a transparent matrix, a glass matrix, a ceramic matrix, or any other suitable material or structure. Phosphor dispersed in a matrix may be, for example, singulated or formed into a tile that is disposed over a light source. The glass matrix may be for example a low melting glass with a softening point below 1000° C., or any other suitable glass or other transparent material. The ceramic matrix material can be for example a fluoride salt such as $CaF_2$ or any other suitable material.

The first luminescent material 1 and the second luminescent material 2 may be used in powder form, for example by mixing the powder phosphor with a transparent material such as silicone and dispensing or otherwise disposing it in a path of light. In powder form, the average particle size (for example, particle diameter) of the phosphors may be at least 1 μm in some embodiments, no more than 50 μm in some embodiments, at least 5 μm in some embodiments, and no more than 20 μm in some embodiments. Individual phosphor particles, or powder phosphor layers, may be coated with one or more materials such as a silicate, a phosphate, and/or one or more oxides in some embodiments, for example to improve absorption and luminescence properties and/or to increase the material's functional lifetime.

Figure 3:
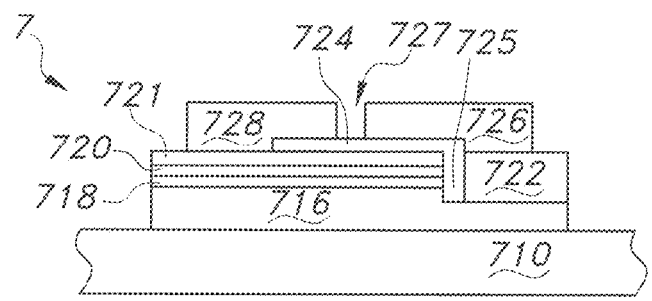
FIG. 3 is a cross sectional view of an LED.

As shown in FIGS. 1 and 2, an illumination device may include a wavelength converting structure that may be used, for example, with light source 7. Light source 7 may be a light emitting diode (LED). Light emitted by the light emitting diode is absorbed by the phosphors in the wavelength converting structure according to embodiments and emitted at a different wavelength. FIG. 3 illustrates one example of a suitable light emitting diode, a III-nitride LED that emits blue light for use in such an illumination system.

Though in the example below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

FIG. 3 illustrates a III-nitride light source 7, such as a LED that may be used in embodiments of the present disclosure. Any suitable semiconductor light emitting device may be used and embodiments of the disclosure are not limited to the device illustrated in FIG. 3. The device of FIG. 3 is formed by growing a III-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 716 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 718 is grown over the n-type region. Examples of suitable light emitting regions include a single thick or thin light emitting layer, or a multiple quantum well light emitting region including multiple thin or thick light emitting layers separated by barrier layers. A p-type region 720 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 721 often includes multiple conductive layers such as a reflective metal and a guard metal which may prevent or reduce electromigration of the reflective metal. The reflective metal is often silver but any suitable material or materials may be used. After forming the p-contact 721, a portion of the p-contact 721, the p-type region 720, and the active region 718 is removed to expose a portion of the n-type region 716 on which an n-contact 722 is formed. The n- and p-contacts 722 and 721 are electrically isolated from each other by a gap 725 which may be filled with a dielectric such as an oxide of silicon or any other suitable material. Multiple n-contact vias may be formed; the n- and p-contacts 722 and 721 are not limited to the arrangement illustrated in FIG. 3. The n- and p-contacts may be redistributed to form bond pads with a dielectric/metal stack, as is known in the art.

In order to form electrical connections to the LED, one or more interconnects 726 and 728 are formed on or electrically connected to the n- and p-contacts 722 and 721. Interconnect 726 is electrically connected to n-contact 722 in FIG. 3. Interconnect 728 is electrically connected to p-contact 721. Interconnects 726 and 728 are electrically isolated from the n- and p-contacts 722 and 721 and from each other by dielectric layer 724 and gap 727. Interconnects 726 and 728 may be, for example, solder, stud bumps, gold layers, or any other suitable structure.

The substrate 710 may be thinned or entirely removed. In some embodiments, the surface of substrate 710 exposed by thinning is patterned, textured, or roughened to improve light extraction.

Any suitable light emitting device may be used in light sources according to embodiments of the disclosure. The invention is not limited to the particular LED illustrated in FIG. 3. An embodiment of the light source 7, such as, for example, a LED is illustrated in FIG. 3.

Figure 4:
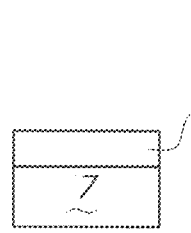
FIG. 4 is a cross sectional view of a device with a wavelength converting structure in direct contact with an LED.
Figure 5:
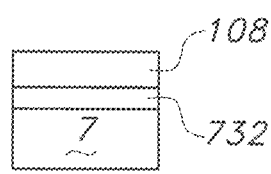
FIG. 5 is a cross sectional view of a device with a wavelength converting structure in close proximity to an LED.
Figure 6:
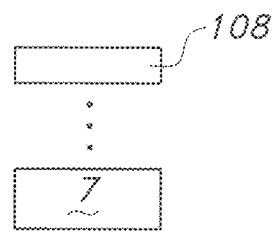
FIG. 6 is a cross sectional view of a device with a wavelength converting structure spaced apart from an LED.

FIGS. 4, 5, and 6 illustrate devices that combine a light source 7, such as a LED and a wavelength converting structure 108. The wavelength converting structure 108 may be, for example, wavelength converting structure 108 including an NIR phosphor as shown in FIG. 1, or wavelength converting structure 108 having an NTR Phosphor and a second phosphor as shown in FIG. 2, according to the embodiments and examples described above.

In FIG. 4, the wavelength converting structure 108 is directly connected to the light source 7, such as a LED. For example, the wavelength converting structure may be directly connected to the substrate 10 illustrated in FIG. 4, or to the semiconductor structure, if the substrate 710 is removed.

In FIG. 5, the wavelength converting structure 108 is disposed in close proximity to light source 7, such as a LED, but not directly connected to the light source 7, such as a LED. For example, the wavelength converting structure 108 may be separated from light source 7, such as a LED, by an adhesive layer 732, a small air gap, or any other suitable structure. The spacing between light source 7, such as a LED, and the wavelength converting structure 108 may be, for example, less than 500 µm in some embodiments.

In FIG. 6, the wavelength converting structure 108 is spaced apart from light source 7, such as a LED. The spacing between light source 7, such as a LED, and the wavelength converting structure 108 may be, for example, on the order of millimeters in some embodiments. Such a device may be referred to as a "remote phosphor" device.

The wavelength converting structure may comprise the first luminescent material and/or the second luminescent material. In the latter embodiment, the wavelength converting structure may e.g. comprise the herein described composition (see also FIG. 7, embodiments I-III).

The wavelength converting structure 108 may be square, rectangular, polygonal, hexagonal, circular, or any other suitable shape. The wavelength converting structure may be the same size as light source 7, such as a LED, larger than light source 7, such as a LED, or smaller than light source 7, such as a LED.

Multiple wavelength converting materials and multiple wavelength converting structures can be used in a single device. Examples of wavelength converting structures include luminescent ceramic tiles; powder phosphors that are disposed in transparent material such as silicone or glass that is rolled, cast, or otherwise formed into a sheet, then singulated into individual wavelength converting structures; wavelength converting materials such as powder phosphors that are disposed in a transparent material such as silicone that is formed into a flexible sheet, which may be laminated or otherwise disposed over an light source 7, such as a LED, wavelength converting materials such as powder phosphors that are mixed with a transparent material such as silicone and dispensed, screen printed, stenciled, molded, or otherwise disposed over light source 7, such as a LED; and wavelength converting materials that are coated on light source 7, such as a LED or another structure by electrophoretic, vapor, or any other suitable type of deposition.

A device may also include other wavelength converting materials in addition to the NIR phosphor and a second phosphor described above, such as, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting materials absorb light emitted by the LED and emit light of one or more different wavelengths. Unconverted light emitted by the LED is often part of the final spectrum of light extracted from the structure, though it need not be. Wavelength converting materials emitting different wavelengths of light may be included to tailor the spectrum of light extracted from the structure as desired or required for a particular application.

Multiple wavelength converting materials may be mixed together or formed as separate structures.

In some embodiments, other materials may be added to the wavelength converting structure or the device, such as, for example, materials that improve optical performance, materials that encourage scattering, and/or materials that improve thermal performance.

Figure 7:
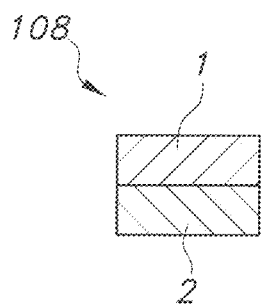
FIG. 7 schematically depict some embodiments.
Figure 7:
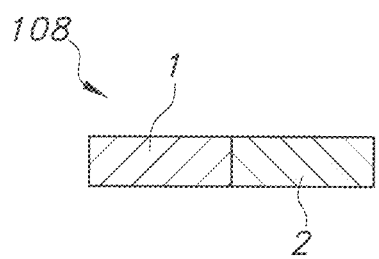
Figure 7:
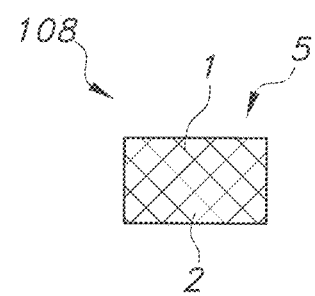

FIG. 7 schematically depict three embodiments wherein the first luminescent material 1 and the second luminescent material 2 are provided as layered structure (I), or are configured adjacent to each other, but not on top of each other (II), or as composition 5.

Figure 8A:
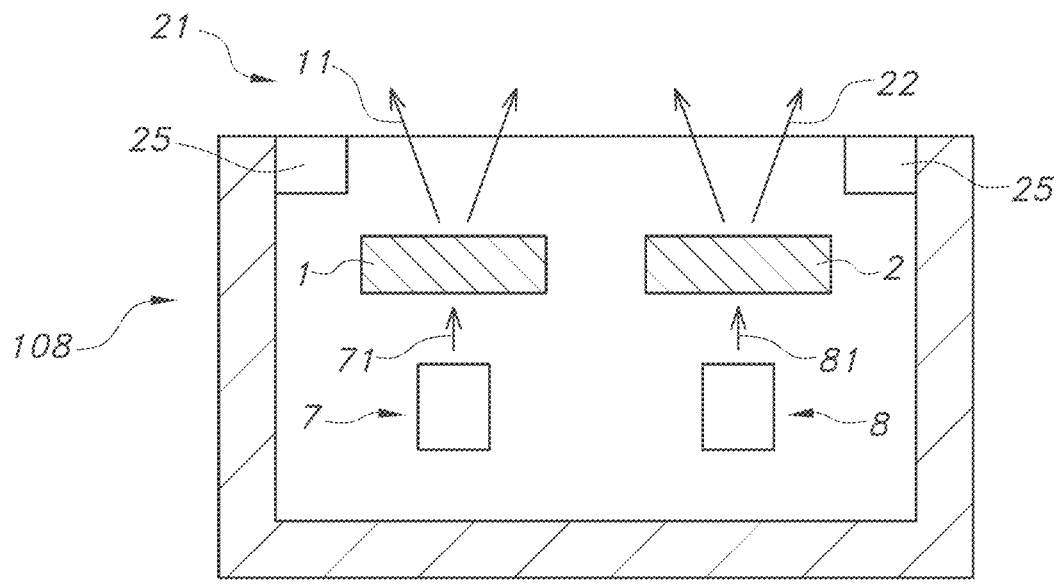
FIGS. 8a-8b schematically depict some embodiments.
Figure 8B:
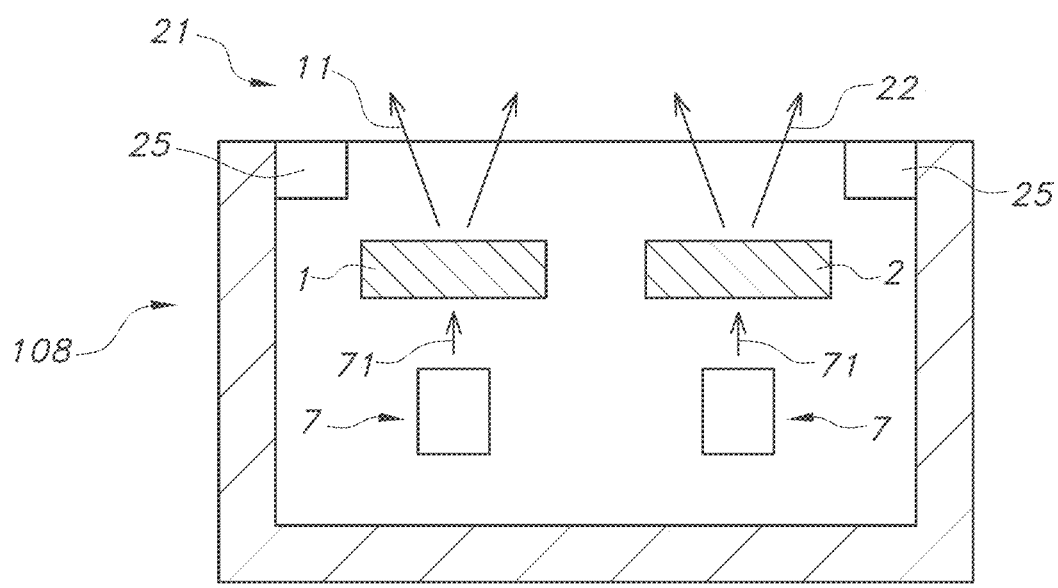

FIG. 8a schematically depict an embodiment of a device 20 comprising also the second luminescent material 2. The device may further optionally comprise a second light source 8 configured to generate second light 81. The second luminescent material 2 may be configured to convert one or more of part of the second light 81 and at least part of the optional second light 81 into second luminescence 22. Further, FIG. 8b schematically depicts an embodiment wherein the same light sources 7 are applied to excite the different luminescent materials. Further, by way of example both embodiments are depicted in combination with an optical sensor 25 configured to detect radiation, such as e.g. in one or more of the red and infrared wavelength ranges.

EXAMPLES

Example 1: $LiSc_{0.94}Si_2O_6:Cr_{0.06}$ 4.418 g scandium oxide (MRE Ltd., 4N), 0.3108 g chromium (III) oxide (Alfa Aesar, 99%), 8.233 g fumed silica (Evonik, Aerosil EG50), 0.231 g lithium tetraborate (Alfa Aesar, 98%) and 2.518 g lithium carbonate (Merck, p.a.) are mixed by planetary ball milling with ethanol. After drying, the powder mixture is fired twice at 1000° C. and 1050° C. in an alumina crucible with intermediate milling. After washing of the milled powder with hydrochloric acid and water and drying at 100° C. the powder is screened to obtain the final phosphor powder.

X-ray diffraction shows that the phosphor is crystallizing in the clinopyroxene structure type with $a_0=9.785$ Å, $b_0=8.926$ Å, $c_0=5.352$ Å and $\beta=110.3°$.

A luminescence measurement (443 nm laser diode excitation) shows an emission band with a centroid wavelength of 865 nm (peak emission at 840 nm) with a full width at half maximum FWHM=154 nm. Internal and external quantum efficiencies are 90.6% and 43.3% respectively.

Example 2: Variation of Cation Composition of Pyroxene Phase

The following phosphor compositions have been prepared according to the method described for example 1:
Example 2-1: $LiSc_{0.85}Lu_{0.09}Si_2O_6:Cr_{0.06}$
Example 2-2: $LiSc_{0.77}Ga_{0.09}Lu_{0.09}Si_2O_6:Cr_{0.06}$
Example 2-3: $LiSc_{0.77}Al_{0.09}Lu_{0.09}Si_2O_6:Cr_{0.06}$
Example 2-4: $LiSc_{0.24}Al_{0.2}In_{0.5}Si_2O_6:Cr_{0.06}$
Example 2-5: $LiSc_{0.43}Al_{0.17}Ga_{0.26}Lu_{0.09}Si_2O_6:Cr_{0.06}$
Example 2-6: $LiSc_{0.54}Al_{0.4}Si_2O_6:Cr_{0.06}$
Example 2-7: $LiSc_{0.54}Ga_{0.4}Si_2O_6:Cr_{0.06}$
Example 2-8: $LiSc_{0.37}Ga_{0.42}Lu_{0.16}Si_2O_6:Cr_{0.06}$ The following Table 2 lists weighed amounts of carbonate, oxide and borate powders (in gram):

TABLE 2

| example | $Li_2CO_3$ | $Sc_2O_3$ | $Cr_2O_3$ | $Al_2O_3$ | $Ga_2O_3$ | $In_2O_3$ | $Lu_2O_3$ | $SiO_2$ | $Li_2B_4O_7$ |
|---|---|---|---|---|---|---|---|---|---|
| 2-1 | 0.941 | 1.463 | 0.114 | — | — | — | 0.447 | 3.000 | 0.084 |
| 2-2 | 0.941 | 1.326 | 0.114 | — | 0.211 | — | 0.447 | 3.000 | 0.084 |
| 2-3 | 0.941 | 1.326 | 0.114 | 0.115 | — | — | 0.447 | 3.000 | 0.084 |
| 2-4 | 0.941 | 0.413 | 0.114 | 0.255 | — | 1.733 | — | 3.000 | 0.084 |
| 2-5 | 0.941 | 0.740 | 0.114 | 0.216 | 0.608 | — | 0.447 | 3.000 | 0.084 |
| 2-6 | 0.941 | 0.930 | 0.114 | 0.509 | — | — | — | 3.000 | 0.084 |
| 2-7 | 0.941 | 0.930 | 0.114 | — | 0.936 | — | — | 3.000 | 0.084 |
| 2-8 | 0.941 | 0.637 | 0.114 | — | 0.983 | — | 0.795 | 3.000 | 0.084 |

After phosphor processing, samples were characterized by means of powder XRD and luminescence spectroscopy. The following Table 3 shows the lattice constants of the clinopyroxene main phase and the luminescence properties for 443 nm excitation.

TABLE 3

| example | $a_0$ (Å) | $b_0$ (Å) | $c_0$ (Å) | $\beta(°)$ | $QE_{int}$ | $\lambda_{centr.}$ (nm) | FWHM (nm) |
|---|---|---|---|---|---|---|---|
| 2-1 | 9.787 | 8.939 | 5.354 | 110.3 | 77 | 870 | 163 |
| 2-2 | 9.778 | 8.922 | 5.349 | 110.3 | 72 | 871 | 164 |
| 2-3 | 9.787 | 8.937 | 5.354 | 110.3 | 74 | 872 | 164 |
| 2-4 | 9.777 | 8.972 | 5.361 | 110.4 | 72 | 870 | 162 |
| 2-5 | 9.751 | 8.869 | 5.337 | 110.3 | 43 | 868 | 168 |
| 2-6 | 9.767 | 8.899 | 5.347 | 110.3 | 64 | 867 | 163 |
| 2-7 | 9.740 | 8.854 | 5.329 | 110.2 | 41 | 860 | 160 |
| 2-8 | 9.714 | 8.837 | 5.318 | 110.2 | 39 | 862 | 170 |

Comparative Example: LiIn0.94Si2O6:Cr0.06

7.145 g indium oxide (Auer Remy, 4N), 0.250 g chromium (III) oxide (Alfa Aesar, 99%), 6.614 g fumed silica (Evonik Aerosil, EG50), 0.185 g lithium tetraborate (Alfa Aesar, 98%) and 2.023 g lithium carbonate (Merck, p.a.) are mixed by planetary ball milling with ethanol. After drying, the powder mixture is fired twice at 1000° C. and 1050° C. in an alumina crucible with intermediate milling. After washing of the milled powder with hydrochloric acid and water and drying at 100° C. the powder is screened to obtain the final phosphor powder.

X-ray diffraction shows that the phosphor is crystallizing in the clinopyroxene structure type with $a_0=9.788$ Å, $b_0=9.014$ Å, $c_0=5.367$ Å and $\beta=110.4°$.

Figure 9A:
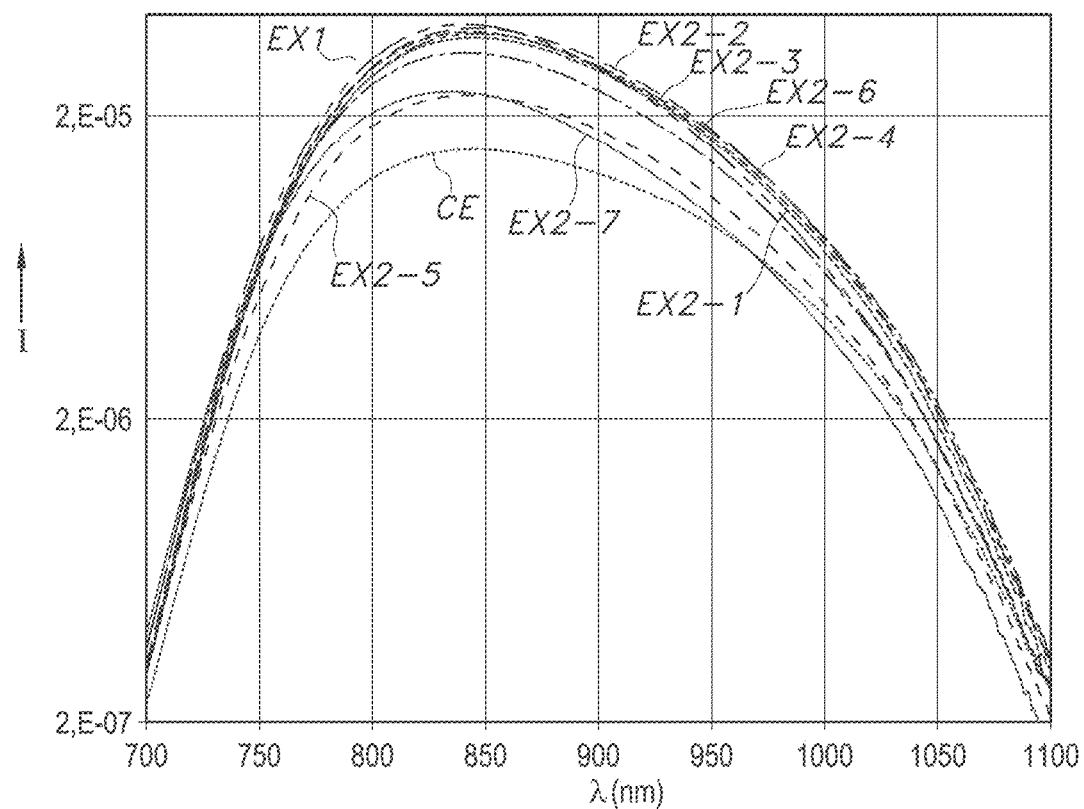

A luminescence measurement (443 nm laser diode excitation) shows an emission band with a centroid wavelength of 874 nm (peak emission at 845 nm) with a full width at half maximum FWHM=188 nm. Internal and external quantum efficiencies are 31.6% and 19.8% respectively. FIG. 9a shows emission bands measured for 443 nm excitation for the samples of above.

Example 3: LiScSi2O6:Cr—MgSiO3 Solid Solutions

The following phosphor compositions have been prepared according to the method described for example 1:
Example 3-1: $Li_{0.9}Sc_{0.85}Mg_{0.2}Si_2O_6:Cr_{0.05}$
Example 3-2: $Li_{0.75}Sc_{0.70}Mg_{0.5}Si_2O_6:Cr_{0.05}$
Example 3-3: $Li_{0.5}Sc_{0.45}MgSi_2O_6:Cr_{0.05}$ The following Table 4 lists weighed amounts of carbonate, oxide and borate powders (in gram):

TABLE 4

| example | $Li_2CO_3$ | $Sc_2O_3$ | MgO | $Cr_2O_3$ | $SiO_2$ | $Li_2B_4O_7$ |
|---|---|---|---|---|---|---|
| 3-1 | 0.841 | 1.463 | 0.202 | 0.095 | 3.004 | 0.085 |
| 3-2 | 0.702 | 1.205 | 0.504 | 0.095 | 3.004 | 0.085 |
| 3-3 | 0.471 | 0.775 | 1.008 | 0.095 | 3.004 | 0.085 |

After phosphor processing, samples were characterized by means of powder XRD and luminescence spectroscopy. The following Table 5 shows the lattice constants of the clinopyroxene main phase and the luminescence properties for 443 nm excitation. While example 3-1 and 3.2 mainly crystallize in the clinopyroxene structure type with some degree of stacking disorder of layers perpendicular to [201], example 3-3 crystallizes in the orthopyroxene structure type and shows stronger emission intensity at shorter wavelengths compared to the examples with lower Mg concentration.

TABLE 5

| example | $a_0$ (Å) | $b_0$ (Å) | $c_0$ (Å) | $\beta(°)$ | $QE_{int}$ | $\lambda_{centr.}$ (nm) | FWHM (nm) |
|---|---|---|---|---|---|---|---|
| 3-1 | 9.793 | 8.912 | 5.340 | 110.3 | 81 | 880 | 176 |
| 3-2 | 9.770 | 8.892 | 5.321 | 110.0 | 83 | 878 | 175 |
| 3-3 | 18.343 | 8.834 | 5.302 | 90 | 83 | 875 | 177 |

Figure 9B:
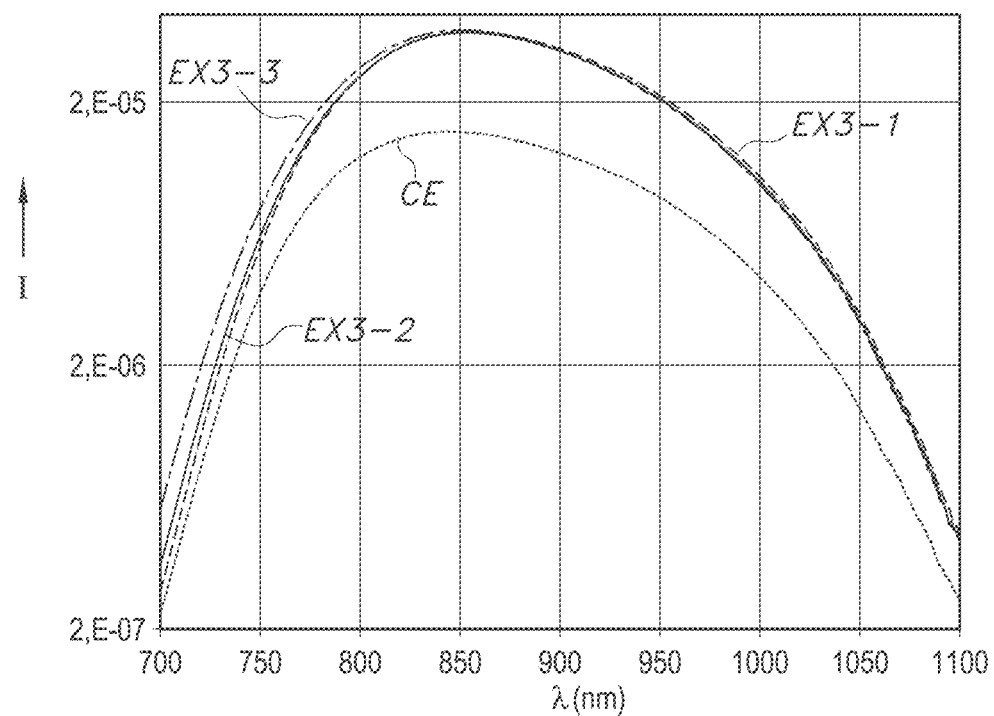

FIG. 9b shows the emission spectra (443 nm excitation) of example 3.

Example 4: NIR Pc LED

In this example, 15 wt % of a $Gd_{2.85}Sc_{1.75}Lu_{0.3}Ga_3O_{12}:Cr_{0.1}$ garnet phosphor powder (prepared by mixing of 61.404 g gadolinium oxide (Treibacher, >3N8), 14.888 g scandium oxide (Treibacher, 4N), 7.279 g lutetium oxide (NEO, 4N), 34.638 g gallium oxide (Molycorp, 4N), 0.925 g chromium oxide (Materion, 2N5) and 1.956 g gadolinium fluoride (Rhodia, 4N) by means of ball milling and firing the mixture twice at 1540° C. and 1510° C. with intermediate milling) and 85 wt % of $Li_{0.75}Sc_{0.70}Mg_{0.5}Si_2O_6:Cr_{0.05}$ phosphor of example 3-2 are mixed in a curable silicone (weight ratio phosphors/silicone=1.6/1) and dispensed into a 2720 midpower LED package equipped with a 450 nm emitting InGaN LED chip. FIG. 3 shows the emission spectrum of the LED from 600-1100 nm with a minimum spectral flux of >0.1 mW/nm for the 750-1000 nm range and a total NIR output of >100 mW.

Figure 9C:
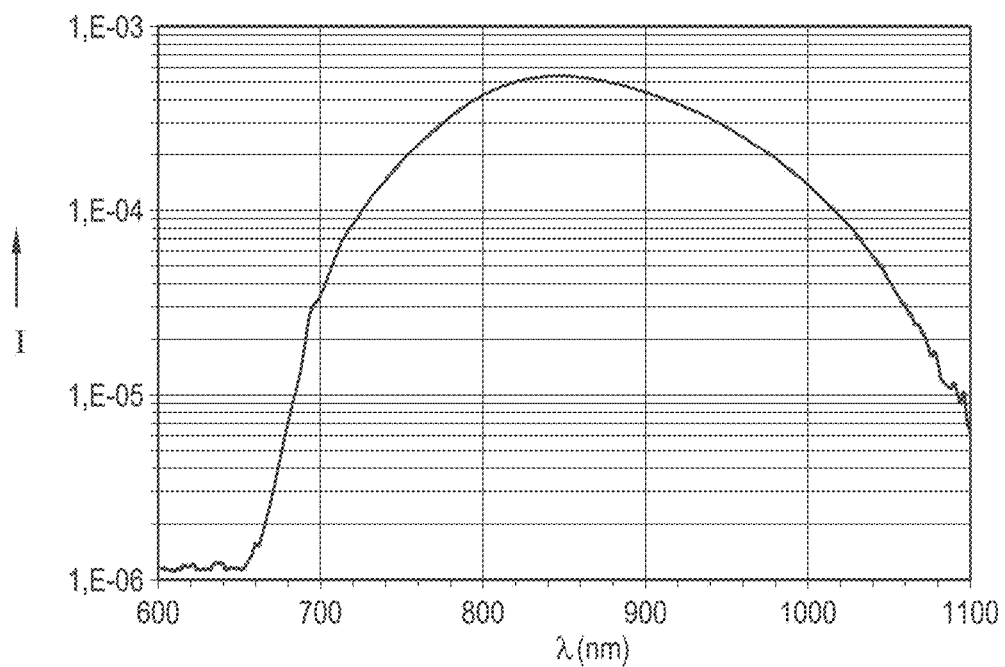

FIG. 9c: Emission spectrum of NIR pcLED of example 4.

Example 5: Broadband Emitting pcLED Covering the 400-1100 nm Spectral Range

Figure 9D:
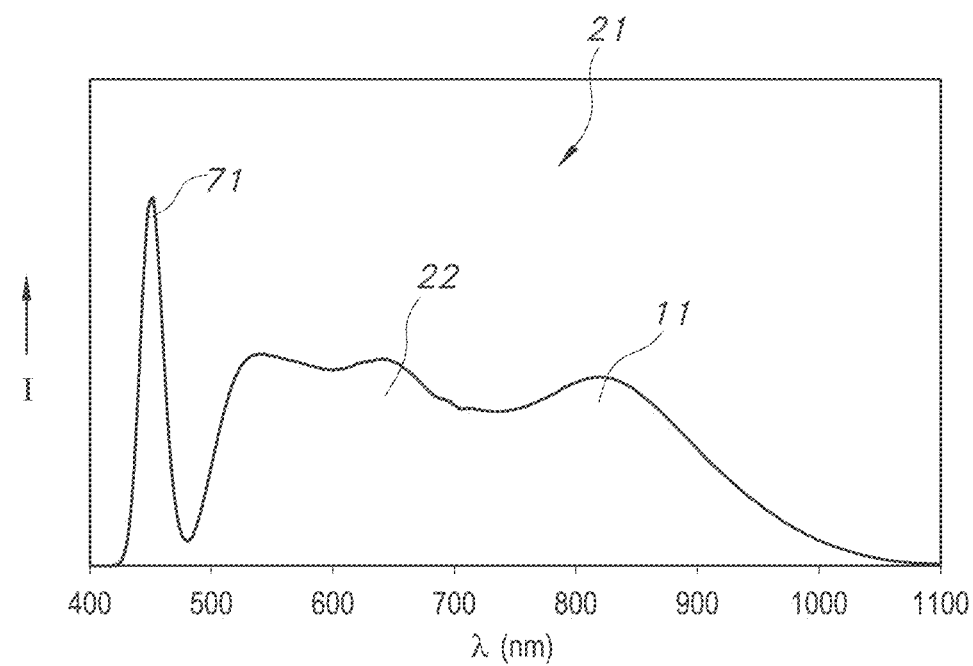

FIG. 9d shows a simulated emission spectrum of a phosphor converted LED that comprises a 450 nm InGaN pump LED and a phosphor mixture comprising $Y_3Al_5O_{12}:Ce$, $CaAlSiN_3:Eu$, $(Gd,Lu)_3Sc_2Ga_3O_{12}:Cr$ and $Li_{0.9}Sc_{0.85}Mg_{0.2}Si_2O_6:Cr_{0.05}$. Such a very broad and continuous band emitting LED device is especially interesting for spectroscopy applications and special applications that require such light sources for testing purposes. An example is a calibration light source for silicon based solar cells with a sun-like spectral power distribution.

FIG. 9d shows a simulated emission spectrum of a phosphor converted LED comprising a 450 nm pump LED and a phosphor mixture comprising $Y_3Al_5O_{12}:Ce$, $CaAlSiN_3:Eu$, $(Gd,Lu)_3Sc_2Ga_3O_{12}:Cr$ and $Li_{0.9}Sc_{0.85}Mg_{0.2}Si_2O_6:Cr_{0.05}$. Here, by way of example the device light 21 comprises the first light 71 from a light source, such as the LED, as well as the first luminesce 11 (from $Li_{0.9}Sc_{0.85}Mg_{0.2}Si_2O_6:Cr_{0.05}$), as well as also second luminescence 22 from $Y_3Al_5O_{12}:Ce$, $CaAlSiN_3:Eu$, and $(Gd,Lu)_3Sc_2Ga_3O_{12}:Cr$.

Hence, even more than two different second luminescent materials may be applied in a device.

Example AE-1: Phosphor of Composition $Li_{0.75}Sc_{0.65}Mg_{0.5}Lu_{0.05}Si_2O_6:Cr_{0.05}$ 3.2 g scandium oxide (MRE Ltd., 4N), 0.2713 g chromium (III) oxide (Alfa Aesar, 99%), 8.623 g fumed silica (Evonik, EG50), 0.2415 g Lithium tetraborate (Alfa Aesar, 99%), 1.9783 g Lithium carbonate (Merck, p.a.), 0.7103 g Lutetium oxide (Rhodia, 4N) and 1.4388 g magnesium oxide (Alfa, 99%) are mixed by ball milling and fired at 1000° C. for 2 hrs, milled and fired again at 1050° C. for 4 hrs. After milling, a phosphor powder is obtained that crystallizes in the clinopyroxene structure type with lattice constants $a_0$=9.7569 Å, $b_0$=8.8989 Å, $c_0$=5.3182 Å and $\beta$=110.0°.

A luminescence measurement (443 nm laser diode excitation) shows an emission band with a centroid wavelength of 881 nm (peak emission at 855 nm) with a full width at half maximum FWHM=177 nm. Internal and external quantum efficiencies are 74% and 44% respectively.

Pc NIR LEDs 30 wt % of a $Gd_{2.85}Sc_{1.75}Lu_{0.3}Ga_3O_{12}:Cr_{0.1}$ garnet phosphor powder (prepared as described for example 4) and 70 wt % of the pyroxene type phosphor of example 3-2 is mixed with a silicone encapsulant gel (phosphor/silicone ratio=1) and dispensed into 2720 type midpower LED packages equipped with 450 nm emitting InGaN LED dies. After curing of the silicone, LED spectra are recorded for 25° C., 55° C. and 85° C. board temperature.

The spectral power distribution in the IR wavelength range show a very high stability over drive current and temperature, which is especially wanted for spectroscopy applications to enable high measurement accuracy and reproducibility.

Example AE-2: Phosphor of Composition $LiSc_{0.89}Zr_{0.05}Si_{1.95}Al_{0.05}O_6: Cr_{0.06}$ 7.5332 g scandium oxide (MRE Ltd., 4N), 0.5597 g chromium (III) oxide (Alfa Aesar, 99%), 14.455 g fumed silica (Evonik, EG50), 0.4152 g Lithium tetraborate (Alfa Aesar, 99%), 4.5351 g Lithium carbonate (Merck, p.a.), 0.3129 g aluminum oxide (Baikowski, RC-SP DBM) and 0.7563 g zirconium oxide (Daiichi, 5N) are mixed by ball milling and fired at 1000° C. for 2 hrs, milled and fired again at 1050° C. for 4 hrs. After milling and washing with diluted hydrochloric acid, water and ethanol a phosphor powder is obtained that mainly crystallizes in the clinopyroxene structure type with lattice constants $a_0$=9.7849 Å, $b_0$=8.9168 Å, $c_0$=5.3475 Å and $\beta$=110.3°

A luminescence measurement (450 nm excitation) shows an emission band with a centroid wavelength of 885 nm (peak emission at 849 nm) with a full width at half maximum FWHM=174 nm. Internal and external quantum efficiencies are 70% and 46% respectively.

Example AE-3: Phosphor of Composition $Li_{0.75}Sc_{0.69}Mg_{0.5}Si_2O_6:Cr_{0.06}$ 5.84 g scandium oxide (MRE Ltd., 4N), 0.5597 g chromium (III) oxide (Alfa Aesar, 99%), 14.826 g fumed silica (Evonik, EG50), 0.4152 g Lithium tetraborate (Alfa Aesar, 99%), 3.4013 g Lithium carbonate (Merck, p.a.), and 2.4737 g magnesium oxide (Alfa, 99%) are mixed by ball milling and fired at 1000° C. for 2 hrs, milled and fired again at 1050° C. for 4 hrs. After milling and washing with diluted hydrochloric acid, water and ethanol a phosphor powder is obtained that crystallizes in the clinopyroxene structure type with lattice constants $a_0$=9.7848 Å, $b_0$=8.9264 Å, $c_0$=5.3519 Å and $\beta$=110.3° and with some degree of stacking disorder of layers perpendicular to crystallographic [201] direction which may be due to some mixing of clinopyroxene and orthopyroxene structure motif stacking sequences.

A luminescence measurement (450 nm excitation) shows an emission band with a centroid wavelength of 888 nm (peak emission at 859 nm) with a full width at half maximum FWHM=185 nm. Internal and external quantum efficiencies are 8200 and 5300 respectively.

Amongst others, embodiments of a phosphor are provided that show (a) a red-shifted emission band compared to materials like $NaScSi2O6:Cr$ or $LiInSi2O6:Cr$, which both show peak emissions at ~840 nm, (b) a high chemical stability, supposedly due to a high Li concentration, and (c)

higher quantum efficiencies compared to materials like NaScSi2O6:Cr or LiInSi2O6: Cr.

Here below, in Table 6 an overview is given of the examples mentioned above:

TABLE 6

|  | Li | Sc | M | Z | y | z | N | w | Si | z | Ge | x |
|---|---|---|---|---|---|---|---|---|---|---|---|---|
| 1 | 1 | 0.94 | — |  | 0 |  | — | 0 | 2 | 0 | — | 0.06 |
| 2-1 | 1 | 0.85 | Lu |  | 0.09 |  | — | 0 | 2 | 0 | — | 0.06 |
| 2-2 | 1 | 0.77 | Ga, Lu |  | 0.09 + 0.09 |  | — | 0 | 2 | 0 | — | 0.06 |
| 2-3 | 1 | 0.77 | Al, Lu |  | 0.09 + 0.09 |  | — | 0 | 2 | 0 | — | 0.06 |
| 2-4 | 1 | 0.24 | Al, In |  | $0.2+0.5$ |  | — | 0 | 2 | 0 | — | 0.06 |
| 2-5 | 1 | 0.43 | Al, Ga, Lu |  | 0.17 + 0.26 + 0.09 |  | — | 0 | 2 | 0 | — | 0.06 |
| 2-6 | 1 | 0.54 | Al |  | 0.4 |  | — | 0 | 2 | 0 | — | 0.06 |
| 2-7 | 1 | 0.54 | Ga |  | 0.4 |  | — | 0 | 2 | 0 | — | 0.06 |
| 2-8 | 1 | 0.37 | Ga, Lu |  | $0.4^{2+}0.16$ |  | — | 0 | 2 | 0 | — | 0.06 |
| Comp. ex. | 1 | — | In |  | 0.94 |  | — | 0 | 2 | 0 | — | 0.06 |
| 3-1 | 0.9 | 0.85 | — |  | 0 |  | Mg | 0.1 | 2 | 0 | — | 0.05 |
| 3-2 | 0.75 | 0.7 | — |  | 0 |  | Mg | 0.25 | 2 | 0 | — | 0.05 |
| 3-3 | 0.5 | 0.45 | — |  | 0 |  | Mg | 0.5 | 2 | 0 | — | 0.05 |
| AE-1 | 0.75 | 0.65 | Lu |  | 0.05 |  | Mg | 0.5 | 2 | 0 | — | 0.05 |
| AE-2 | 1 | 0.89 | — | Zr |  | 0.05 | — | 0 | 1.95 | 0.05 | — | 0.06 |
| AE-3 | 0.75 | 0.69 | — |  | 0 |  | Mg | 0.25 | 2 | 0 | — | 0.06 |

The phosphor may especially be combined with a shorter wavelength emitting JR and/or red phosphor and a (blue) emitting pump LED to provide a broadband red/NIR pcLED that emits at one or more wavelengths in the 600-1100 nm wavelength range, especially over a broad wavelength range, and with a high efficiency. While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any (later) reference signs in the claims or the numbered clauses below should not be construed as limiting the scope.

The following enumerated clauses provide additional non-limiting aspects of the disclosure.

1. A luminescent material (1) comprising $E_{1-w}Sc_{1-x-y-u-w}M_yZ_uA_{2w}Si_{2-z-u}Ge_zAl_uO_6:Cr_x$, wherein:
   E comprises one or more of Li, Na, and K;
   M comprises one or more of Al, Ga, In, Tm, Yb, and Lu;
   Z comprises one or more of Ti, Zr, and Hf;
   A comprises one or more of Mg, Zn, and Ni;
   $0<x\leq0.25$;
   $0\leq y\leq0.75$;
   $0\leq z\leq2$;
   $0\leq u\leq1$;
   $0\leq w\leq1$;
   $x+y+u+w\leq1$; and
   $z+u\leq2$ 2. The luminescent material (1) according to clause 1, wherein:
   E at least comprises Li;
   M at least comprises Lu and/or A at least comprises Mg;
   when A comprises Mg, $0.1\leq w\leq0.4$;
   $0.01<x\leq0.1$;
   $0\leq y\leq0.2$; and
   $0\leq z\leq0.5$.

3. The luminescent material (1) according to any one of the preceding clauses, wherein $0\leq z\leq0.05$.

4. The luminescent material (1) according to any one of the preceding clauses, wherein Z at least comprises Zr.

5. The luminescent material (1) according to any one of the preceding clauses, wherein $0\leq u\leq0.25$.

6. The luminescent material (1) according to any one of the preceding clauses, wherein $0.02\leq y\leq0.2$.

7. The luminescent material (1) according to any one of the preceding clauses, wherein $0\leq w\leq0.5$.

8. The luminescent material (1) according to any one of the preceding clauses, comprising one or more of $LiSc_{1-x-y}Lu_ySi_2O_6:Cr_x$, $LiSc_{1-x-y}(Lu,Al)_ySi_2O_6:Cr_x$, and $Li_{1-w}Sc_{1-x-y}Mg_{2w}Si_2O_6:Cr_x$.

9. A luminescent material composition (5) comprising (a) the luminescent material (1) according to any one of the preceding clauses and (b) a second luminescent material (2); wherein the luminescent material (1) is excitable with first light (71), wherein the luminescent material (1) is configured to provide first luminescence (11) upon irradiation with the first light (71), wherein the second luminescent material (2) is configured to provide second luminescence (22) upon irradiation with the first light (71), wherein the luminescent material (2) and the second luminescent material (5) are configured to provide first and second luminescence (11,22) in one or more of the red and infrared wavelength ranges, and wherein the first and second luminescence (11,22) have different centroid wavelengths ($\lambda_1, \lambda_2$).

10. The luminescent material composition (5) according to clause 9, wherein the second luminescent material (2) comprises one or more of:
   $RE_3Ga_{5-x-y}A_xSiO_{14}:Cr_y$ (RE=La, Nd, Gd, Yb, Tm; A=Al, Sc), wherein $0\leq x\leq1$ and $0.005\leq y\leq0.1$;
   $Gd_{3-x}RE_xSc_{2-y-z}Ln_yGa_{3-w}Al_wO_{12}:Cr_z$ (Ln=Lu, Y, Yb, Tm; RE=La, Nd, Lu), wherein $0\leq x\leq3$; $0\leq y\leq1.5$; $0<z\leq0.3$; and $0\leq w\leq2$;
   $AAEM_{1-x}F_6:Cr_x$ (A=Li, Cu; AE=Sr, Ca; M=Al, Ga, Sc), wherein $0.005<x\leq0.2$;
   $A_{2-x}(WO_4)_3:Cr_x$ (A=Al, Ga, Sc, Lu, Yb), wherein $0.003\leq x\leq0.5$;

$Sc_{1-x-y}A_yMO:Cr_x$, wherein $MO=BO_3$, or $MO=P_3O_9$, or $MO=(BP_3O_{12})_{0.5}$, or $MO=(SiP_5O_{19})_{0.34}$, with A=Lu, In, Yb, Tm, Y, Ga, Al, wherein $0<x\leq0.75$, $0\leq y\leq1$;

$M_{2-x}Si_{5-y}Al_yO_yN_{8-y}:Eu_x$ (M=Ba, Sr, Ca), wherein $0<x\leq0.05$, $0\leq y\leq0.1$;

$M_{1-x}SiAlN_3:Eu_x$ (M=Sr, Ca), wherein $0<x\leq0.03$; and $M_{1-x}LiAl_3N_4:Eu_x$ (M=Ba, Sr, Ca), wherein $0<x\leq0.02$.

11. The luminescent material composition (5) according to any one of the preceding clauses 9-10, wherein the second luminescent material (2) comprises $Gd_{3-x}RE_xSc_{2-y-z}Ln_yGa_{3-w}Al_wO_{12}:Cr_z$ (Ln=Lu, Y, Yb, Tm; RE=La, Nd, Lu), wherein $0\leq x\leq3$; $0\leq y\leq1.5$; $0<z\leq0.3$; and $0\leq w\leq2$.

12. A device (20) comprising:
a first light source (7) configured to generate first light (71); and
the luminescent material (1) as defined in any one of the preceding clauses, wherein the luminescent material (1) is configured to convert at least part of the first light (71) in first luminescence (11).

13. The device (20) according to clause 12, comprising:
the second luminescent material (2) as defined in any one of the preceding clauses 9-11; and
optionally a second light source (8) configured to generate second light (81);
wherein the second luminescent material (2) is configured to convert one or more of (a) part of the second light (81) and (b) at least part of the optional second light (81) into second luminescence (22).

14. The device (20) according to any one of the preceding clauses 12-13, comprising (a) the luminescent material (1) as defined in clause 8 and (b) the second luminescent material (2) as defined in clause 11.

15. The device (20) according to any one of the preceding clauses 12-14, further comprising an optical sensor (25) configured to detect radiation in one or more of the red and infrared wavelength ranges.

The invention claimed is:

1. A luminescent material comprising $E_{1-w}Sc_{1-x-y-u-w}M_yZ_uA_{2w}Si_{2-z-u}Ge_zAl_u:Cr_x$, wherein:
E comprises one or more of Li, Na, and K;
M comprises one or more of Al, Ga, In, Tm, Yb, and Lu;
Z comprises one or more of Ti, Zr, and Hf;
A comprises one or more of Mg, Zn, and Ni;
$0<x\leq0.25$;
$0\leq y\leq0.75$;
$0\leq z\leq2$;
$0\leq u\leq1$;
$0\leq w\leq1$;
$1+y+u+w>0$; and
$z+u\leq2$.

2. The luminescent material according to claim 1, wherein:
E at least comprises Li;
M at least comprises Lu and/or A at least comprises Mg;
when A comprises Mg,
$0.1\leq w\leq0.4$;
$0.01\leq x\leq0.1$;
$0\leq y\leq0.2$; and
$0\leq z\leq0.5$.

3. The luminescent material according to claim 1, wherein $0\leq z\leq0.05$.

4. The luminescent material according to claim 1, wherein Z at least comprises Zr.

5. The luminescent material according to claim 1, wherein $0\leq u\leq0.25$.

6. The luminescent material according to claim 1, wherein $0.02\leq y\leq0.2$.

7. The luminescent material according to claim 1, wherein $0\leq w\leq0.5$.

8. The luminescent material according to claim 1, comprising one or more of $LiSc_{1-x-y}Lu_ySi_2O_6:Cr_x$, $LiSc_{1-x-y}(Lu,Al)Si_2O_6:Cr_x$, and $Li_{1-w}Sc_{1-x-w}Mg_{2w}Si_2O_6:Cr_x$.

9. A luminescent material composition comprising (a) the luminescent material according to claim 1 and (b) a second luminescent material; wherein the luminescent material is excitable with first light, wherein the luminescent material is configured to provide first luminescence upon irradiation with the first light, wherein the second luminescent material is configured to provide second luminescence upon irradiation with the first light, wherein the luminescent material and the second luminescent material are configured to provide first and second luminescence in one or more of the red and infrared wavelength ranges, and wherein the first and second luminescence have different centroid wavelengths ($\lambda_1,\lambda_{b\,2}$).

10. The luminescent material composition according to claim 9, wherein the second luminescent material comprises one or more of:

$RE_3Ga_{5-x-y}A_xSiO_{14}:Cr_y$ (RE=La, Nd, Gd, Yb, Tm; A=Al, Sc), wherein $0\leq x\leq1$ and $0.005\leq y\leq0.1$;

$Gd_{3-x}RE_xSc_{2-y-z}Ln_yGa_{3-w}Al_wO_{12}:Cr_z$ (Ln=Lu, Y, Yb, Tm; RE=La, Nd, Lu), wherein $0\leq x\leq3$; $0\leq y\leq1.5$; $0\leq z\leq0.3$; and $0\leq w\leq2$;

$AAEM_{1-x}F_6:Cr_x$ (A=Li, Cu; AE=Sr, Ca; M=Al, Ga, Sc), wherein $0.005<x\leq0.2$;

$A_{2-x}(WO_4)_3:Cr_x$ (A=Al, Ga, Sc, Lu, Yb), wherein $0.003\leq x\leq0.5$;

$Sc_{1-x-y}A_yMO:Cr_x$, wherein $MO=BO_3$, or $MO=P_3O_9$, or $MO=(BP_3O_{12})_{0.5}$, or $MO=(SiP_5O_{19})_{0.34}$, with A=Lu, In, Yb, Tm, Y, Ga, Al, wherein $0<x\leq0.75$, $0\leq y\leq1$;

$M_{2-x}Si_{5-y}Al_yO_yN_{8-y}:Eu_x$ (M=Ba, Sr, Ca), wherein $0<x\leq0.05$, $0\leq y\leq0.1$;

$M_{1-x}SiAlN_3:Eu_x$ (M=Sr, Ca), wherein $0<x\leq0.03$; and $M_{1-x}LiAl_3N_4:Eu_x$ (M=Ba, Sr, Ca), wherein $0<x\leq0.02$.

11. The luminescent material composition according to claim 9, wherein the second luminescent material comprises $Gd_{3-x}RE_xSc_{2-y-z}Ln_yGa_{3-w}Al_wO_{12}:Cr_z$ (Ln=Lu, Y, Yb, Tm; RE=La, Nd, Lu), wherein $0\leq x\leq3$; $0\leq y\leq1.5$; $0<z\leq0.3$; and $0\leq w\leq2$.

12. A device comprising:
a first light source configured to generate first light; and
the luminescent material as defined in claim 1, wherein the luminescent material is configured to convert at least part of the first light into first luminescence.

13. The device according to claim 12, comprising:
a second luminescent material configured to provide second luminescence upon irradiation with the first light, wherein the luminescent material and the second luminescent material are configured to provide first and second luminescence in one or more of the red and infrared wavelength ranges, and wherein the first and second luminescence have different centroid wavelengths ($\lambda_1,\lambda_2$); and
optionally a second light source configured to generate second light;
wherein the second luminescent material is configured to convert one or more of (a) part of the second light and (b) at least part of the optional second light into second luminescence.

14. The device according to claim 12, wherein:
the luminescent material comprises one or more of $LiSc_{1-x-y}Lu_ySi_2O_6:Cr_x$, $LiSc_{1-x-y}(Lu,Al)_ySi_2O_6:Cr_x$, and $Li_{1-w}Sc_{1-x-w}Mg_{2w}Si_2O_6:Cr_x$; and
a second luminescent material configured to provide second luminescence upon irradiation with the first light, wherein the luminescent material and the second luminescent material are configured to provide first and second luminescence in one or more of the red and infrared wavelength ranges, and wherein the first and second luminescence have different centroid wavelengths ($\lambda_1,\lambda_2$), the second luminescent material comprising $Gd_{3-x}RE_xSc_{2-y-z}Ln_yGa_{3-w}Al_wO_{12}:Cr_z$ (Ln=Lu, Y, Yb, Tm; RE=La, Nd, Lu), wherein $0 \leq x \leq 3$; $0 \leq y \leq 1.5$; $0 < z \leq 0.3$; and $0 \leq w \leq 2$.

15. The device according to claim 12, further comprising an optical sensor configured to detect radiation in one or more of the red and infrared wavelength ranges.

16. A luminescent material comprising $Li_{1-w}Sc_{1-x-w}Mg_{2w}Si_2O_6:Cr_x$, wherein $0<x\leq0.25$; $0\leq w\leq1$; and $x+w\leq1$.

17. The luminescent material according to claim 16, wherein $0\leq w\leq0.5$.

18. A luminescent material composition comprising (a) the luminescent material according to claim 16 and (b) a second luminescent material; wherein the luminescent material is excitable with first light, wherein the luminescent material is configured to provide first luminescence upon irradiation with the first light, wherein the second luminescent material is configured to provide second luminescence upon irradiation with the first light, wherein the luminescent material and the second luminescent material are configured to provide first and second luminescence in one or more of the red and infrared wavelength ranges, and wherein the first and second luminescence have different centroid wavelengths $Gd_{3-x}RE_xSc_{2-y-z}Ln_yGa_{3-w}Al_wO_{12}:Cr_z$ ($\lambda_1,\lambda_2$).

19. The luminescent material composition according to claim 18, wherein the second luminescent material comprises (Ln=Lu, Y, Yb, Tm; RE=La, Nd, Lu), wherein $0\leq x \leq 3$; $0\leq y\leq 1.5$; $0\leq z\leq 0.3$; and $0\leq w\leq 2$.

20. A device comprising:
a first light source configured to generate first light; and
the luminescent material as defined in claim 16, wherein the luminescent material is configured to convert at least part of the first light into first luminescence.

* * * * *

UNITED STATES PATENT AND TRADEMARK OFFICE
CERTIFICATE OF CORRECTION

PATENT NO. : 11,508,883 B2
APPLICATION NO. : 16/829932
DATED : November 22, 2022
INVENTOR(S) : Peter Josef Schmidt It is certified that error appears in the above-identified patent and that said Letters Patent is hereby corrected as shown below:

In the Claims

Column 25, Line 39 Claim 1: replace "$E_{1-w}Sc_{1-x-y-u-w}M_yZ_uA_{2w}Si_{2-z-u}Ge_zAl_u:Cr_x$" with
-- $E_{1-w}Sc_{1-x-y-u-w}M_yZ_uA_{2w}Si_{2-z-u}Ge_zAl_uO_6:Cr_x$ --

Column 26, Line 4-5 Claim 8: replace "$LiSc_{1-x-y}(Lu, Al)Si_2O_6:Cr_x$" with
-- $LiSc_{1-x-y}(Lu,Al)_ySi_2O_6:Cr_x$ --

Column 26, Line 17 Claim 9: replace "$(\lambda_1,\lambda_{b\,2})$" with -- $(\lambda_1,\lambda_2)$ --

Column 26, Line 24 Claim 10: replace "$0 \leq z \leq 0.3$" with -- $0 < z \leq 0.3$ --

Column 26, Line 29 Claim 10: replace "$0.005 < x \leq 0.2$" with -- $0.005 \leq x \leq 0.2$ --

Column 28, Line 9 Claim 18: remove "$Gd_{3-x}RE_xSc_{2-y-z}Ln_yGa_{3-w}Al_wO_{12}:Cr_z$"

Column 28, Line 12 Claim 19: replace "(Ln=Lu, Y, Yb, Tm; RE=La, Nd, Lu)" with
-- $Gd_{3-x}RE_xSc_{2-y-z}Ln_yGa_{3-w}Al_wO_{12}:Cr_z$ (Ln=Lu, Y, Yb, Tm; RE=La, Nd, Lu) --

Column 28, Line 13 Claim 19: replace "$0 \leq z \leq 0.3$" with -- $0 < z \leq 0.3$ --

Signed and Sealed this
Fourteenth Day of March, 2023

*Katherine Kelly Vidal*
Katherine Kelly Vidal
*Director of the United States Patent and Trademark Office*